United States Patent [19]
Ishibashi et al.

[11] Patent Number: 5,872,471
[45] Date of Patent: Feb. 16, 1999

[54] SIMULTANEOUS BIDIRECTIONAL TRANSMISSION CIRCUIT

[75] Inventors: Kenichi Ishibashi, Kokubunji; Takehisa Hayashi; Tsutomu Goto, both of Sagamihara; Akira Yamagiwa, Kanagawa-ken; Toshitsugu Takekuma, Ebina; Toshiro Takahashi, Hamura; Tatsuhiro Aida, Ome, all of Japan

[73] Assignee: Hitachi, Ltd., Tokyo, Japan

[21] Appl. No.: 773,307

[22] Filed: Dec. 24, 1996

[30] Foreign Application Priority Data

Dec. 25, 1995 [JP] Japan ................................. 7-336564

[51] Int. Cl.$^6$ ................................................. H03K 17/00
[52] U.S. Cl. ............................. 327/98; 327/68; 326/30; 326/86
[58] Field of Search .................................. 326/30, 83, 86; 327/98, 541, 68, 69, 56

[56] References Cited

U.S. PATENT DOCUMENTS

| | | | |
|---|---|---|---|
| 4,719,369 | 1/1988 | Asano et al. | 307/443 |
| 5,371,424 | 12/1994 | Quigley et al. | 326/63 |
| 5,514,983 | 5/1996 | Yoshino | 326/86 |
| 5,541,535 | 7/1996 | Cao et al. | 326/83 |
| 5,604,450 | 2/1997 | Borkar et al. | 326/82 |
| 5,668,834 | 9/1997 | Takehuma et al. | 375/257 |

OTHER PUBLICATIONS

T. Takahaski, et al., "A CMOS Gate Array with 600Mb/s Simultaneous Bidirectional I/O Circuits", IEEE–ISSCC Digest of Technical Papers, Feb., 1995, pp. 40–41.

*Primary Examiner*—Timothy P. Callahan
*Assistant Examiner*—Jung Ho Kim
*Attorney, Agent, or Firm*—Antonelli, Terry, Stout & Kraus, LLP

[57] ABSTRACT

In a simultaneous bidirectional transmission circuit for conducting simultaneous two-way communication between LSIs via a transmission line, an input/output circuit connected to the transmission line is included in an LSI. The input/output circuit has a driver and a receiver. The driver sends out an output signal depending on a logical signal within the LSI to the transmission line. The receiver receives a mixed signal having a mixture of a received signal and the output signal via the transmission line. The signal to be received by the receiver in an LSI has been sent out to the transmission line by the other party i.e., another LSI in communication therewith. The receiver receives the logical signal output as well. The receives derives a difference between the mixed signal and the logical signal output, thereby removing the component of the logical signal from the mixed signal, and outputs the received signal. The receiver has a reference circuit for receiving the logical signal and outputting it to a bias circuit, a bias circuit for generating a divided voltage signal in conjunction with internal resistance of the reference circuit, and a differential receiver for receiving the mixed signal and the divided voltage signal and outputting the difference between them. The reference circuit and the bias circuit are formed by using MOS transistors.

16 Claims, 11 Drawing Sheets

NOISE APPEARING ON OUTPUT OF ACTIVE DRIVER

NOISE APPEARING ON OUTPUT OF QUIET DRIVER

NOISE APPEARING ON POWER SUPPLY

SIMULTANEOUS BIDIRECTIONAL TRANSMISSION CIRCUIT

BACKGROUND OF THE INVENTION

The present invention relates to a simultaneous bidirectional transmission circuit for simultaneously transmitting and receiving signals by using a single transmission line. In particular, the present invention relates to a simultaneous bidirectional transmission circuit suitable for transmitting and receiving data between LSI (large-scale integrated circuit) chips even when the power supply voltage of LSIs is made low.

The simultaneous bidirectional transmission circuit has an input/output circuit at each of ends of a single transmission line, and transmits and receives signals simultaneously via the transmission line. As compared with a typical conventional transmission circuit using separate transmission lines respectively for the transmitting operation and the receiving operation, the number of lines is reduced to half. Therefore, the simultaneous bidirectional transmission circuit is especially useful, for example, in computers which transmit and receive several tens or more data. Typically in the computer application, a plurality of input/output circuits are contained in an LSI chip included in a computer. Between a pair of input/output circuits of LSI chips, a single transmission line is connected. In the case of a plurality of input/output circuits, a plurality of data are transmitted and received via a plurality of transmission lines. In some cases, the number of input/output circuits contained in a single LSI chip is one hundred or more.

In a conventional driver for sending a signal to a transmission line, the output resistance of a driver seen from a connection point of the driver with the transmission line should coincide with the impedance of the transmission line. The necessity of this impedance matching is described in the U.S. Pat. No. 4,719,369. In a driver disclosed in the U.S. Pat. No. 4,719,369, MOS transistors having different internal resistance values obtained by changing gate widths are connected in parallel. By selectively providing those MOS transistors with gate inputs, the output resistance of the driver is controlled so as to coincide with the characteristic impedance. Thus the impedance matching is accomplished.

On the other hand, a simultaneous bidirectional transmission circuit is disclosed in U.S. Pat. No. 5,514,983. A signal existing at the connection point of the simultaneous bidirectional transmission circuit with the input/output circuit contains a mixture of an output signal of the input/output circuit and a received signal which is sent from the other party and which should be received. In order to remove the output signal and extract the received signal from the mixed signal, a differential receiver is provided. By controlling the gate voltage of a reference circuit for outputting a part of the output signal to the differential receiver and the gate voltage of the final stage of the driver in an analog way, the output resistance is provided with a predetermined value.

As the gate voltage of nMOS transistors included in a transmission circuit and nMOS transistors included in the reference circuit described in the aforementioned U.S. Pat. No. 5,514,983, Vc1 outputted from a differential amplifier is supplied. Considering that the power supply voltage of current LSIs is typically 3.3 V, the Vc1 does not exceed 3.3 V, which is the power supply voltage VDD1 of the differential amplifier. Actually, since it is necessary to assure the control range of Vc1, the minimum value of Vc1 becomes approximately 2.5 V. Furthermore, for keeping the output resistance of each of nMOS transistors at a constant value, it is necessary to make the transistors operate in a triode region as described in the U.S. Pat. No. 5,514,983. It is thus necessary to set the power supply voltage VDD2 to be supplied to the drain terminal of each of these nMOS transistors to a voltage of (Vc1−Vth) or less, where Vth is the threshold voltage of an nMOS transistor activated in the source follower operation and Vth is typically at least 1 V. Furthermore, taking the dispersion of the power supply voltage into consideration, the practical value of the VDD2 is approximately 0.8 V. In this case, the (+) input of the differential amplifier based upon the ternary logic has a value of 0.8 V (=VDD2), 0.4 V (=VDD2/2), or 0 V, and the (−) input of the differential amplifier functioning as the reference signal has a value of 0.6 V (=3VDD2/4) or 0.2 V (=VDD2/4). The input amplitude between the (+) input and the (−) input of the differential amplifier becomes ±200 mV. It is significantly smaller than ±400 mV which is the operation amplitude of typical differential amplifiers. Thus, an amplitude large enough to withstand noise cannot be assured. When the method of controlling the output resistance by using the gate voltage of nMOS transistors as described in the U.S. Pat. No. 5,514,983 is employed, therefore, it is difficult to assure the input amplitude of the differential amplifier for the power supply voltage under the present situation, i.e., 3.3 V, or a lower power supply voltage value in the future. Furthermore, since the Vc1 is generated by an analog feedback loop, problems of noise and oscillation are also posed.

SUMMARY OF THE INVENTION

An object of the present invention is to provide a simultaneous bidirectional transmission circuit free from the above described problems and capable of conducting high speed data transfer by assuring an amplitude large enough to withstand noise even when the power supply voltage of LSIs is made lower.

In accordance with the present invention, the above described problems are solved by the following means. A first power supply having a high level to be supplied to LSIs (hereafter referred to as Vdd), a second power supply having a low level, and a third power supply which is intermediate in potential between the first power supply and the second power supply (hereafter referred to as Vddq) are provided. The maximum level of the output voltage of the driver included in the input/output circuit is made equal to the potential of the third power supply. In the same way as the driver disclosed in the aforementioned U.S. Pat. No. 4,719,369, a plurality of transistors having different gate widths are prepared and transistors to be turned on are selected in a digital way so as to match the output resistance of the driver with the characteristic impedance of the transmission line. Furthermore, the driver is formed by using nMOS transistors, and the potential to be applied to the gate terminal is made equal to the potential of the first power supply which is the highest potential used in LSIs or the potential of the second power supply which is the lowest potential. As for the divided signal of the output signal obtained by the voltage dividing function using resistors, a reference driver and a bias circuit respectively formed by nMOS transistors are used. MOS resistance values of nMOS transistors are set so as to produce a voltage division ratio of 1:1. In the same way as the driver, the potential applied to the gate terminal of transistors is made equal to the potential of the first or second power supply. For example, in the case where the gate voltage is 3.3 V which is the typically used power supply voltage, the potential of the third power supply to be supplied to the drain terminal of the nMOS transistor of the pull-up side is set to approximately 1.6 V as a sufficiently low voltage equivalent to (Vdd−Vth) or less in accordance with a calculation similar to that described in the aforementioned U.S. Pat. No. 4,719,369. At this time, the (+) input of the differential amplifier based upon the ternary logic has a value of 1.6 V (=Vddq), 0.8 V (=Vddq/2), or 0 V, and the (−) input of the differential amplifier functioning as the reference signal has a value of 1.2 V (=3Vddq/4) or 0.4 V (=Vddq/4). The input amplitude generated between the (+) input and the (−) input of the differential amplifier becomes ±400 mV. In other words, ±400 mV which is the operation amplitude of typical differential amplifiers can be assured in the case of the typical supply voltage 3.3 V under the present situation.

Even if noise is taken into consideration, therefore, a sufficient amplitude can be assured for the typical power supply voltage value of 3.3 V under the present situation. Thus the operation is sufficiently possible for a lowered power supply voltage.

The above described problems can also be efficiently solved by using different means hereafter described. Without using the third power supply, only voltages of the first power supply and the second power supply are fed to the input/output circuit. Between one of connection points of the input/output circuits with the transmission line and the first power supply and between the other of the connection points of the input/output circuits with the transmission line and the second power supply, resistors (hereafter referred to as termination resistors) are connected, respectively. The termination resistors are disposed outside the LSIs. A composite impedance value formed by an output resistance value $\alpha Z0$ ($\alpha>1$) of a driver included in the input/output circuit and a resistance value $\beta Z0$ ($\beta>1$) of a termination resistor is matched with a characteristic impedance Z0 of the transmission line. The driver is formed by using CMOS transistors. In the same way as the first described means, the driver impedance is controlled. The divided voltage signal of the output signal obtained by the voltage dividing function using resistors is set according to a voltage dividing ratio of $(2\alpha-1):1$ by using a reference driver including CMOS transistors and a bias circuit including CMOS transistors. The potential applied to the gate terminal of each of transistors used in the driver or the reference is set to the highest potential or the lowest potential used in LSIs.

In the case where the third power supply is not provided, the maximum level of the driver included in the input/output circuit becomes the potential of the first power supply, resulting in increased power consumption. By providing termination resistors as in the present means, however, the power consumption can be reduced. If the driver resistance of the input/output circuit is formed by the driver and $\alpha=2$ and $\beta=2$, i.e., both the driver resistance value of the driver and the resistance value of the termination resistor are set to twice the characteristic impedance of the transmission line to accomplish matching, the average power consumed by the input/output circuit is reduced by approximately 40% as compared with the case where there are no termination resistors. Furthermore, the input amplitude generated between the (+) input and the (−) input of the differential amplifier becomes ±412.5 mV. A sufficient amplitude value can thus be assured also when the present means is employed.

As $\alpha$ is increased, the average power consumption increases. On the other hand, the input amplitude of the differential amplifier is decreased and the differential amplifier becomes susceptible to the influence of noise. Since there are two mutually contradictory aspects, a favorable result can be obtained by letting $\alpha=2$ and $\beta=2$ and making the voltage division ratio equivalent to 3:1.

DESCRIPTION OF THE PREFERRED EMBODIMENTS

By referring to some illustrated embodiments, a simultaneous bidirectional transmission circuit according to the present invention will hereafter be described in more detail.

Figure 1:
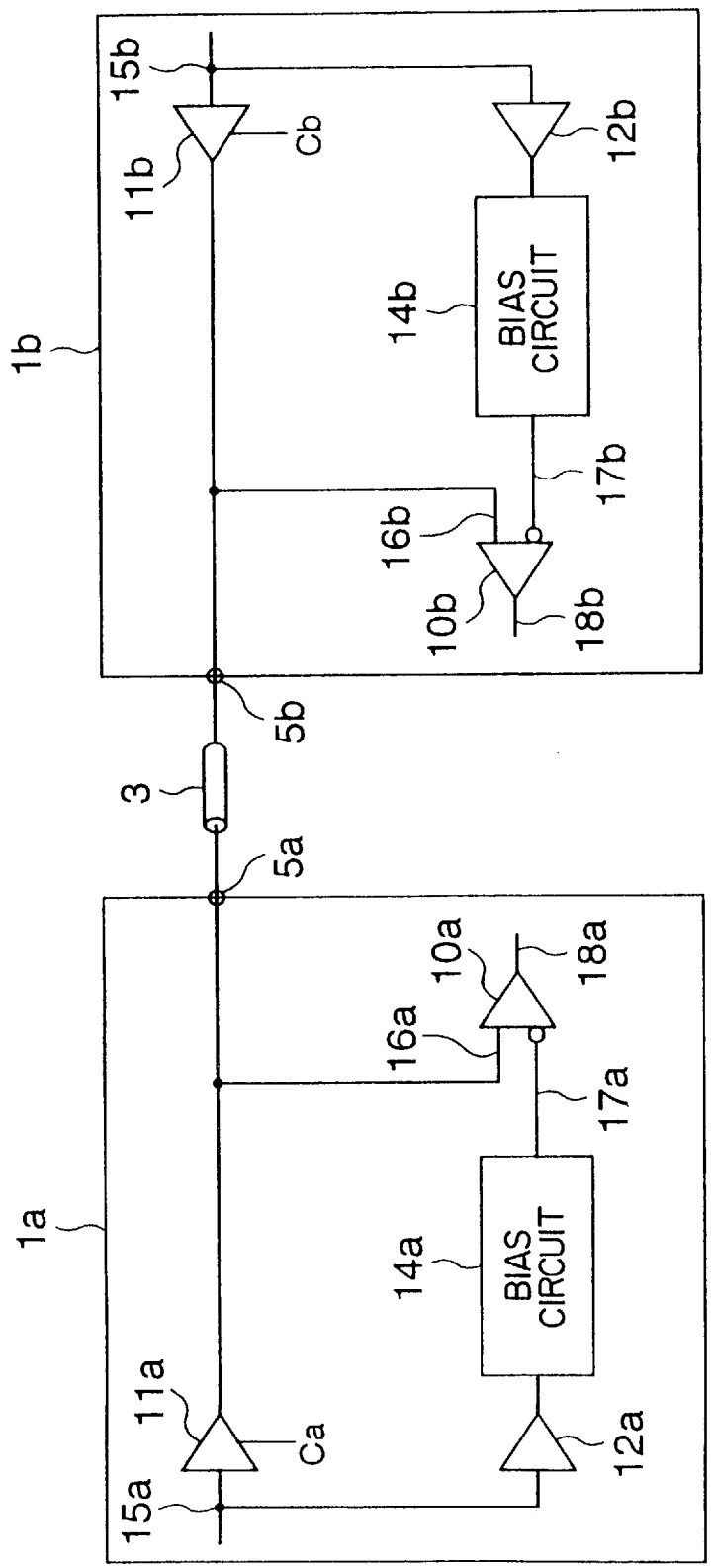
FIG. 1 is a block diagram of a first embodiment of a simultaneous bidirectional transmission circuit according to the present invention.

FIG. 1 is a block diagram showing a first embodiment of a simultaneous bidirectional transmission circuit according to the present invention.

In FIG. 1, 1a and 1b denote input/output circuits provided on LSIs. Typically, on an LSI chip used in a computer system or the like, several tens or more input/output circuits are disposed. Numeral 3 denotes a transmission line, which is wiring disposed on a printed circuit board to connect the input/output circuit 1a to the input/output circuit 1b. Characters 5a and 5b denote connection points between the input/output circuits 1a and 1b and the transmission line 3, respectively. Characters 11a and 11b denote drivers, 12a and 12b reference drivers, and 10a and 10b differential receivers. The driver 11a and the reference driver 12a, and the driver 11b and the reference driver 12b have input terminals 15a and 15b, respectively. In addition, control signals Ca and Cb for controlling output resistance values are inputted to the drivers 11a and 11b, respectively. The differential receiver 10a has two input terminals 16a and 17a and an output terminal 18a. In the same way, the differential receiver 10b has two input terminals 16b and 17b and an output terminal 18b. The differential receivers 10a and 10b extract signals transmitted via the transmission line 3 and output the signals to the output terminals 18a and 18b, respectively. Characters 14a and 14b denote bias circuits. The bias circuits 14a and 14b apply voltage division to outputs of the reference drivers 12a and 12b, and supply resultant voltages to input terminals 17a and 17b respectively of the differential receivers 10a and 10b, respectively. Although the input/output circuit will hereafter be described in detail by taking the input/output circuit 1a as an example, the same holds true for the input/output circuit 1b as well.

For applying matching termination to the received signal, an equivalent resistance of the driver 11a is squared with a characteristic impedance of the transmission line by the control signal Ca. In order to make the input of the differential receiver 10a cancel the output signal, the output of the reference driver 12a subjected to voltage division in the bias circuit 14a (divided voltage signal) is inputted to the input terminal 17a and a signal on the transmission line 3 is inputted to the input terminal 16a. The signal on the transmission line 3 is a composite signal including outputs of the drivers 11a and 11b. Since the output of the driver 11a is equal to the output of the reference driver 12a, the input of the differential receiver 10a can cancel the output of the driver 11a by setting the potential of the input terminal 17a to a suitable value according to the output of the reference driver 12a. Thus the output of the driver 11b can be received properly.

The input/output circuit 1a will be described in further detail by referring to FIG. 2.

Figure 2:
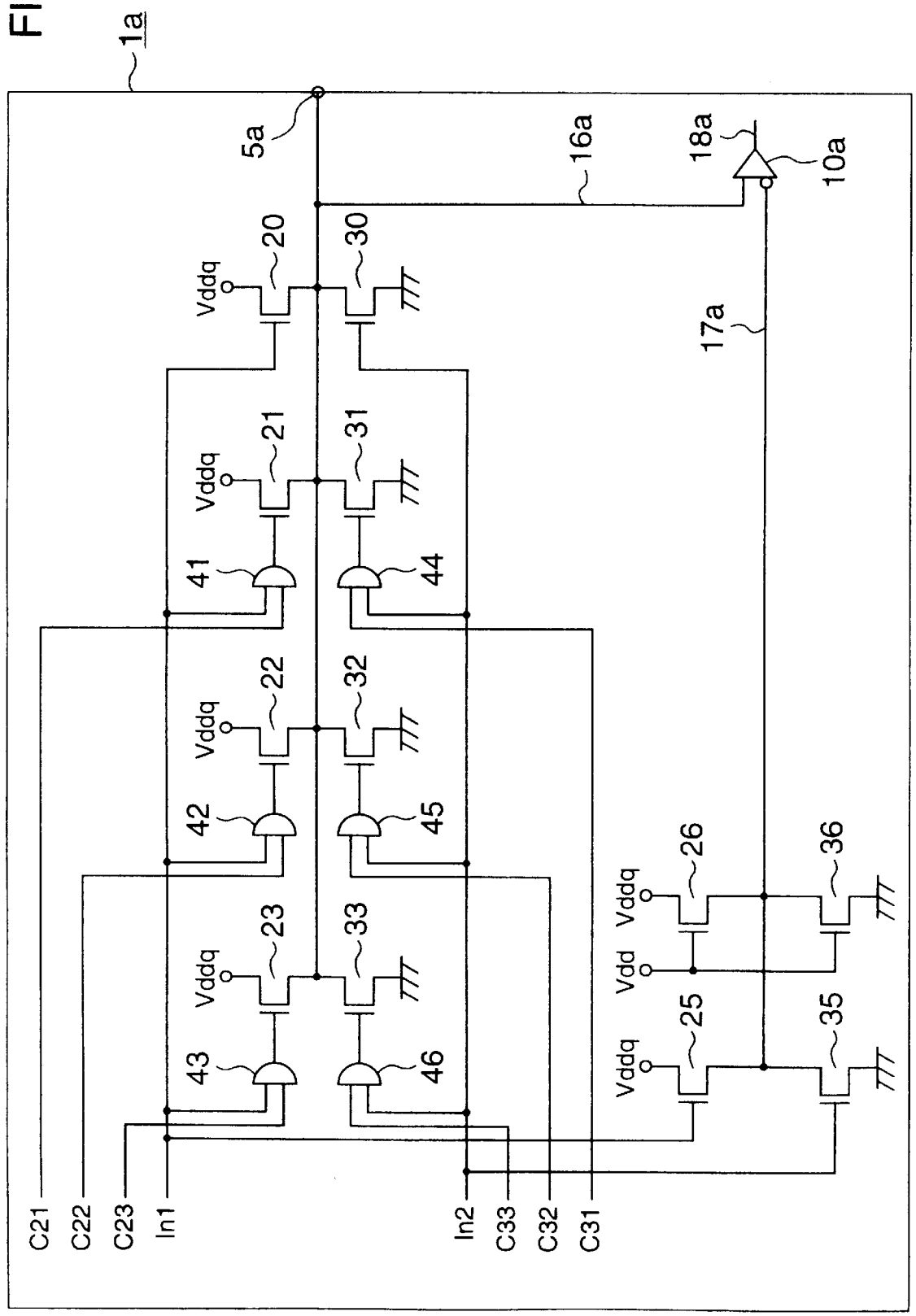
FIG. 2 is a circuit configuration diagram illustrating the detailed configuration of an input/output circuit.

In FIG. 2, numerals 20 through 23 and 30 through 33 denote nMOS transistors forming the driver 11a. Numerals 25 and 35 denote nMOS transistors forming the reference driver 12a. Numerals 26 and 36 denote nMOS transistors forming the bias circuit 14a. (Hereafter, they are referred to simply as transistors.) In FIG. 2, In1 and In2 are signals forming the input signal (hereafter represented as In) supplied to the driver 11a and the reference driver 12a illustrated in FIG. 1. The signal In1 becomes the input signal for the transistors 20 through 23 and the transistor 25. The signal In2 becomes the input signal for the transistors 30 through 33 and the transistor 35. The input signal In1 is opposite to the input signal In2. For example, in the case where the In is a high level, the In1 becomes a high level and In2 becomes a low level. C21 through C23 and C31 through C33 denote control signals for controlling on/off of the transistors 21 through 23 and the transistors 31 through 33. The control signals are signals corresponding to the control signal Ca illustrated in FIG. 1. In FIG. 2, Vdd denotes a power supply for supplying a voltage to inside of the LSI, gate terminals of the transistors 26 and 36, AND circuits 41 through 46, and the differential receiver 10a. Furthermore, Vddq denotes a power supply for supplying a voltage to drain terminals of the transistors 20 through 23, and the transistors 25 and 26. Source terminals of the transistors 20 through 23 are connected to the connection point 5a for the transmission line. Source terminals of the transistors 25 and 26 are connected to the input terminal 17a of the differential receiver 10a.

As the value of Vddq is decreased, the power consumption decreases, but the output amplitude also decreases, resulting in an increased risk of a false operation. Therefore, the lower limit of the Vddq is limited by the operation stability. If both input/output circuits connected to the ends of the transmission line have output high levels, the gate potential of at least one transistor among the transistors 20 through 23 (the output potential of the AND circuits 41 through 43) becomes Vdd. If at this time Vdd is nearly equal to Vddq, then the transistors 20 through 23 turn off before the potential at the connection point 5a rises to the Vddq. As a result, the driver resistance value becomes high, and the matching termination cannot be effected. For preventing the transistors from turning off, expression (1) must always be satisfied irrespective of the potential at the connection point 5a. It is necessary to set the upper limit of the Vddq to a value sufficiently lower than the Vdd minus the threshold voltage Vth of an nMOS transistor in the source follower operation. At this time, expression (2) is always satisfied simultaneously and the transistors operate in the triode region, operation with a constant resistance value being thus made possible. In the expressions, Vgs represents gate-source voltage and Vds represents drain-source voltage.

$$Vgs > Vth \quad (1)$$

$$Vds < Vgs - Vth \quad (2)$$

In current LSIs, Vdd=3.3 V is typically used. And the threshold voltage Vth of an nMOS transistor in the source follower operation is approximately 1 to 1.3 V. It is desirable that Vddq is 2.3 V to 2.0 V or less. Taking variation of the power supply voltage into consideration, Vddq is actually set to a lower value, i.e., approximately 1.6 V.

When the transistors 30 through 33 turn on, the expressions (1) and (2) are satisfied because of the gate voltage Vdd=3.3 V, the source voltage being equal to 0 V, the drain voltage being at most 1.6 V, and the threshold voltage being typically 0.5 V. The operation with a constant resistance value thus becomes possible.

For applying the matching termination to the received signal, the equivalent resistance values (hereafter referred to as R1) of the transistors 20 through 23, outputting the high levels, and the transistors 30 through 33 outputting the low levels are made equal to the characteristic impedance of the transmission line 3. The resistance value of transistors typically varies significantly under the influence of process variation. However, it is possible to make the resistance value of transistors equal to a predetermined resistance value by setting the control signals C21 through C23 and C31 through C33 to appropriate values. For example, it is accomplished by setting the potential values of the control signals C21 through C23 and C31 through C33 so as to make the resistance values of the transistors equal to the resistance values of the resistors disposed outside the LSI in the same way as a method described in Digest of Technical Papers, pp. 40–41, International Solid-State Circuits Conference 95 published in February 1995.

Figure 3A:
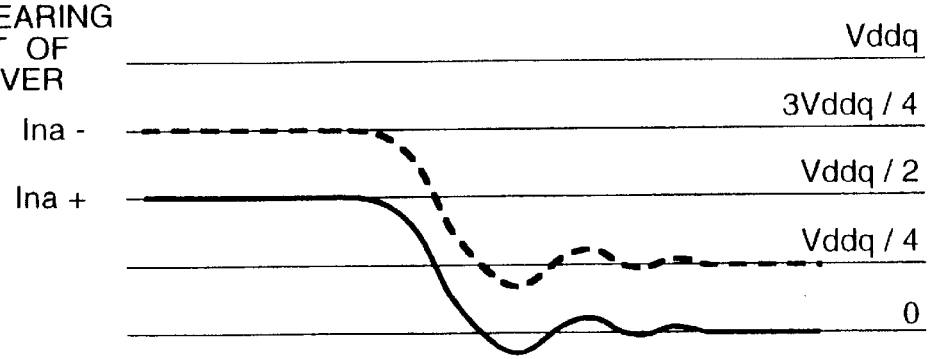
FIGS. 3A, 3B and 3C are signal waveform diagrams showing noise waveforms at input terminals of a differential receiver.
Figure 3B:
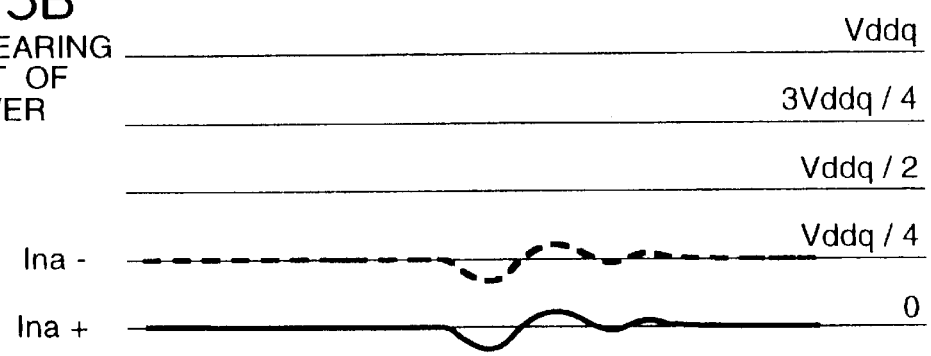
Figure 3C:
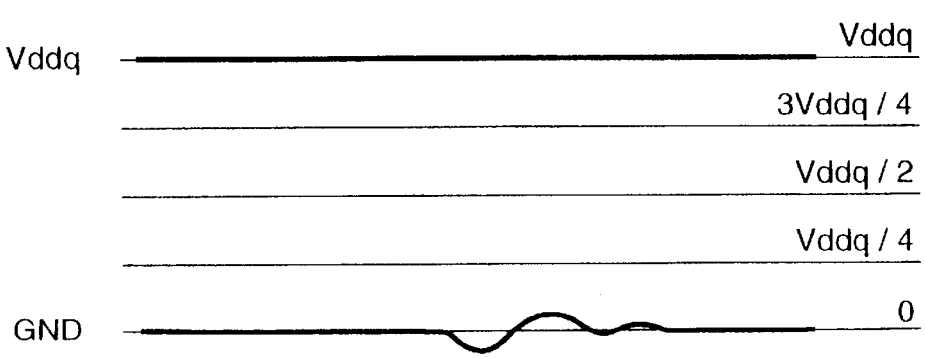

For making the input of the differential receiver 10a cancel the output signal, the ratio of the equivalent resistance value (hereafter referred to as R2) of the transistors 25 and 35 to the equivalent resistance value (hereafter referred to as R3) of the transistors 26 and 36 is set to 1:1 thereby to produce a voltage division ratio of 1:1. Typically, there is dispersion in transistor characteristics between pMOS and NMOS. In the present embodiment, dispersion between transistors is suppressed and accurate voltage division is accomplished by forming the reference driver 12a and the bias circuit 14a by using only nMOS transistors. Furthermore, in order to make the delay time caused between the In1 or In2 and the input terminal 16a of the differential receiver 10a by the driver 11a nearly equal to the delay time caused between the the In1 or In2 and the input terminal 17a of the differential receiver 10a by the reference driver 12a, the reference driver 12a has a circuit configuration similar to that of the driver 11a and the size and load of transistors are properly selected. Furthermore, the Vddq power supplies connected to the transistors 20 through 23, 25 and 26 are made common, and the ground power supplies connected to the transistors 30 through 33, 35 and 36 are made common so that noise occurring on the power supply will appear on the input terminals 16a and 17a of the differential receiver 10a with nearly equal levels. It is known that noise such as simultaneous switching noise or ringing is generated by inductance of the power supply pin when a plurality of drivers are simultaneously switched. It is now assumed that the output of the other party is a low level and a plurality of lines in its own output are simultaneously switched from a high level to a low level. FIG. 3A, FIG. 3B and FIG. 3C are a signal waveform diagram showing the noise appearing at this time on the output of an active driver, the noise appearing on the output of a quiet driver kept at the low level, and the noise appearing on Vddq and the ground power supply GND, respectively. In FIGS. 3A and 3B, Ina+ represents the signal waveform obtained on the input terminal 16a and Ina− represents the signal waveform obtained on the input terminal 17a. The noise caused on the GND by simultaneous switching appears on the Ina+ and Ina−. However, the noise becomes common noise because the power supply is common to the driver 11a, the reference driver 12a and the bias circuit 14a. Therefore, the risk of false operation is small.

From the facts heretofore described, the influence of the cancel error of the output at the input terminal of the differential receiver and the power supply noise can be reduced. Thus high speed operation can be conducted. In the same way as R1, resistance values of R2 and R3 may also be controlled. Resistors built into the LSI may also be used. Furthermore, if the maximum level of the output voltage of the drivers (11a and 11b) is set to half of that of the conventional technique, the average power consumed in the driver (average power derived assuming that the occurrence probability of outputting a high level or a low level from the input/output circuit is equal) in the present embodiment can be reduced to one fourth that of the conventional technique.

Potential values of respective terminals of the simultaneous bidirectional transmission circuit in the present embodiment become as shown in TABLE 1. The input/output circuits 1a and 1b can receive signals outputted by the other party, respectively. In TABLE 1, Ina represents the input of the driver 11a and the reference driver 12a, Ina+ the input of the input terminal 16a of the differential receiver 10a, Ina− the input of the input terminal 17a of the differential receiver 10a, Outa the output of the output terminal 18a of the differential receiver 10a. In the same way, Inb represents the input of the driver 11b and the reference driver 12b, Inb+ the input of the input terminal 16b of the differential receiver 10b, Inb− the input of the input terminal 17b of the differential receiver 10b, Outb the output of the output terminal 18b of the differential receiver 10b. In the following description, these reference characters are used to represent the potentials of respective terminals in FIG. 1.

The input Ina− of the differential receiver 10a has a potential value ranging from Vddq/4 to 3 Vddq/4. If Vddq= 1.6 V, the potential value ranges from 0.4 V to 1.2 V. The gate voltage of the nMOS transistors 25 and 35 forming the reference driver 12a is Vdd, i.e., 3.3 V. The gate voltage of the nMOS transistors 26 and 36 forming the bias circuit 14a is Vdd, i.e., 3.3 V. Since the highest potential of the Ina− is 1.2 V, the nMOS transistors 25, 35, 26 and 36 operate in the triode region in the same way as the transistors 21 through 23 and 31 through 33. Operation with a constant resistance value thus becomes possible. The input amplitude (Ina+)− (Ina−) of the differential receiver 10a is ±Vddq/4. It becomes ±400 mV in the case where Vddq=1.6 V. Actually, this input amplitude of ±400 mV is decreased by various dispersion factors. For example, the input amplitude is decreased by approximately ±50 mV due to the power supply voltage dispersion, by approximately ±50 mV due to the adjustment error of the driver resistance value, by approximately ±30 mV due to dispersion of the voltage division signal caused by the fabrication process of nMOS transistors, by approximately ±20 mV due to the crosstalk noise between the transmission lines, and by approximately ±30 mV due to the power supply noise. Taking these values into consideration, the effective input amplitude becomes ±220 mV. Typical differential receivers at the present time can operate provided that the effective input amplitude is ±200 mV. Even if various dispersions are taken into consideration, therefore, there is a margin. By designing the drivers 11a and 11b, the reference drivers 12a and 12b, and the bias circuits 14a and 14b as heretofore described, a sufficient amplitude can be obtained even in the LSIs designed to use a lowered supply voltage.

Figure 4:
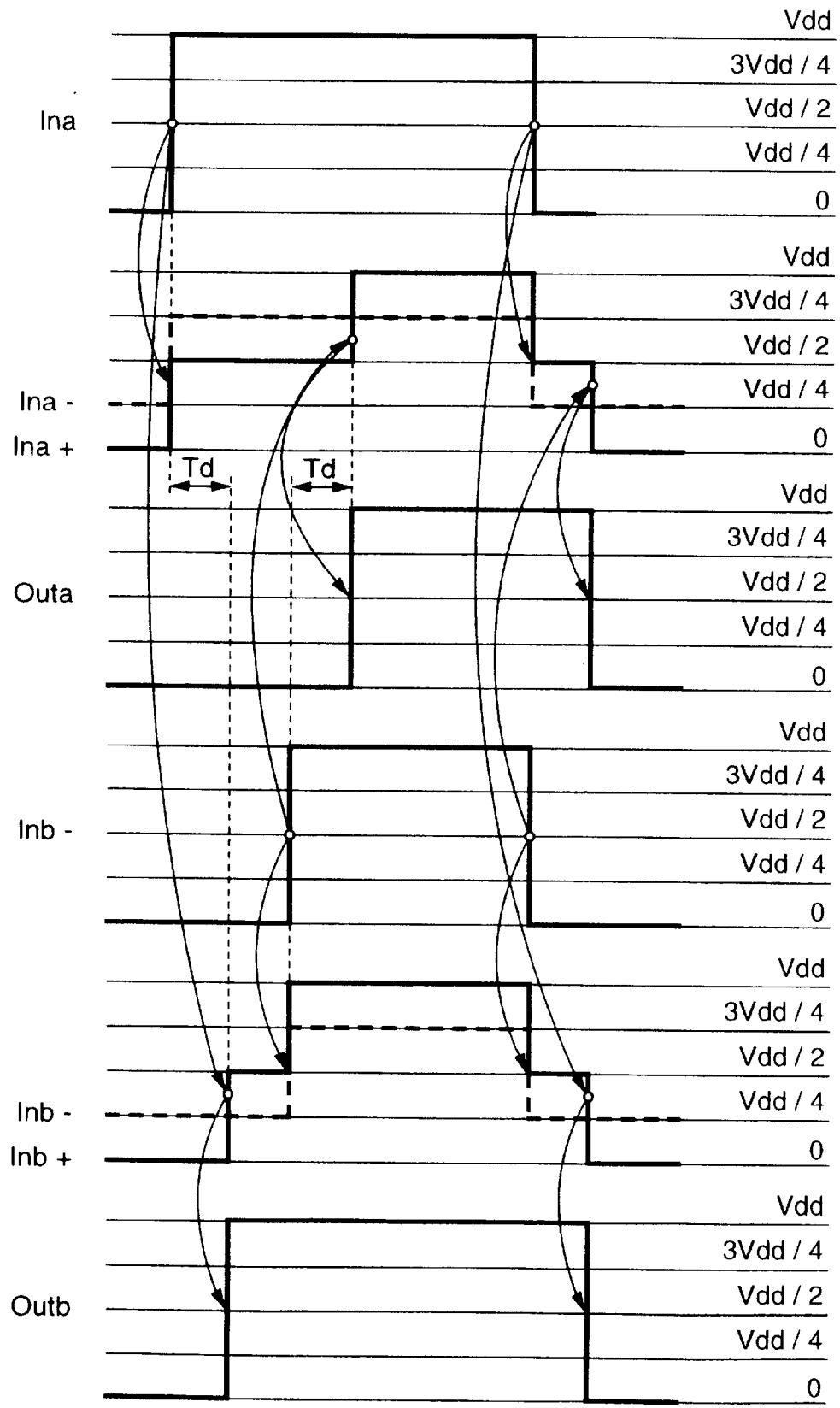
FIG. 4 is a time chart showing the operation of the input/output circuit.

FIG. 4 is a time chart illustrating the operation of the present embodiment shown in FIG. 1. The signal propagation delay of the transmission line 3 is Td. When the Ina changes from 0 to Vdd, the INa− changes from Vddq/4 to 3Vddq/4 and the Ina+ changes from 0 to Vddq/2. At this time, the potential difference (Ina+)−(Ina−) between the Ina+ and the Ina− remains to be −Vddq/4, and the Outa does not change. In the case where the Ina+ and the Ina− change simultaneously, the potential difference (Ina+)−(Ina−) between the Ina+ and the Ina− is kept at −Vddq/4. In the case where the Ina+ changes faster than the Ina−, for example, however, the difference (Ina+)−(Ina−) temporarily becomes positive and the Outa rises, noise being caused. In order to avoid this noise, it is necessary to make the propagation delay of the route from the input terminal 15a to the input terminal 16a equal to some degree to the propagation delay of the route from the input terminal 15a to the input terminal 17a. Since the driver 11a and the reference driver 12a have the same circuit configuration, however, such a design can be accomplished comparatively easily. On the other hand, the Inb+ changes from 0 to Vddq/2 with a delay of Td after the Ina+ changed. Since the Inb− does not change, the potential difference (Inb+)−(Inb−) between the Inb+ and the

TABLE 1

| INPUT/OUTPUT CIRCUIT 1a | | | | | INPUT/OUTPUT CIRCUIT 1b | | | | |
|---|---|---|---|---|---|---|---|---|---|
| Ina | Ina+ | Ina− | (Ina+) − (ina−) | Outa | Inb | Inb+ | Inb− | (Inb+) − (Inb−) | Outb |
| 0 | 0 | Vddq/4 | −Vddq/4 | 0 | 0 | 0 | Vddq/4 | −Vddq/4 | 0 |
| 0 | Vddq/2 | Vddq/4 | Vddq/4 | Vdd | Vdd | Vddq/2 | 3Vddq/4 | −Vddq/4 | 0 |
| Vdd | Vddq/2 | 3Vddq/4 | −Vddq/4 | 0 | 0 | Vddq/2 | Vddq/4 | Vddq/4 | Vdd |
| Vdd | Vddq | 3Vddq/4 | Vddq/4 | Vdd | Vdd | Vddq | 3Vddq/4 | Vddq/4 | Vdd |

Inb− changes from −Vddq/4 to Vddq/4 and the Outb changes from 0 to Vdd. Thus the input/output circuit 1b can receive the output signal of the input/output circuit 1a correctly.

If the Inb then changes from 0 to Vdd, the Inb− changes from Vddq/4 to 3Vddq/4 and the Inb+ changes from Vddq/2 to Vddq. At this time, the potential difference (Inb+)−(Inb−) between the Inb+ and the Inb− remains to be Vddq/4, and the potential of the Outb does not change. On the other hand, the Ina+ changes from Vddq/2 to Vddq with a delay of Td after the Inb+ changed. Since the Ina− does not change, the potential difference (Ina+)−(Ina−) between the Ina+ and the Ina− changes from −Vddq/4 to Vddq/4 and the Outa changes from 0 Vdd. Thus the input/output circuit 1a can receive the output signal of the input/output circuit 1b correctly. Also in the case where the Ina or Inb changes from Vdd to 0, the output of the input/output circuit of the other party can be received correctly in the same way.

Figure 5:
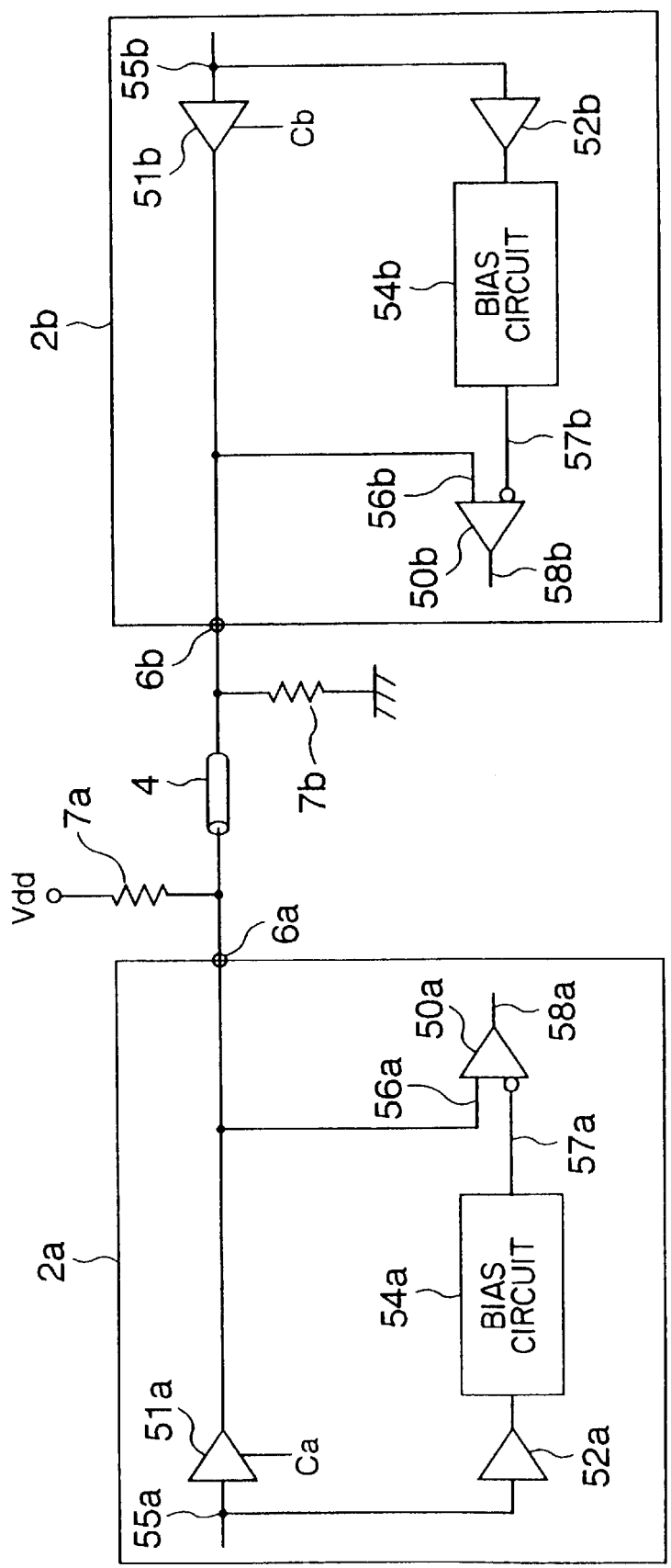
FIG. 5 is a block diagram of a second embodiment of a simultaneous bidirectional transmission circuit according to the present invention.

FIG. 5 is a block diagram showing a second embodiment of the simultaneous bidirectional transmission circuit according to the present invention.

In FIG. 5, 2a and 2b denote input/output circuits disposed on LSIs. Numeral 4 denotes a transmission line connecting the input/output circuits 2a and 2b. Character 6a denotes a connection point of the input/output circuit 2a with the transmission line 4. Character 6b denotes a connection point of the input/output circuit 2b with the transmission line 4. Character 51a denotes a driver which has 55a as its input terminal and which is included in the input/output circuit 2a. Character 52a denotes a reference driver which has 55a as its input terminal and which is included in the input/output circuit 2a. The output resistance value of the driver 51a (51b) is adapted to be controlled by a control signal Ca (Cb). Character 51b denotes a driver which has 55b as its input terminal and which is included in the input/output circuit 2b. Character 52b denotes a reference driver which has 55b as its input terminal and which is included in the input/output circuit 2b. Character 50a denotes a differential receiver which has two input terminals 56a and 57a and which is included in the input/output circuit 2a. To an output terminal 58a, the differential receiver 50a outputs the signal transmitted from the input/output circuit 2b via the transmission line 4. In the same way, character 50b denotes a differential receiver which has two input terminals 56b and 57b and which is included in the input/output circuit 2b. To an output terminal 58b, the differential receiver 50b outputs the signal transmitted from the input/output circuit 2a via the transmission line 4. Characters 54a and 54b denote bias circuits. Characters 7a and 7b denote termination resistors disposed outside the input/output circuits such as on the printed circuit board.

The term ination resistor 7a is connected between the power supply Vdd and the transmission line 4. The termination resistor 7b is connected between the transmission line 4 and the ground potential. While the ensuing description will be given for the input/output circuit 2a, the same holds true for the input/output circuit 2b as well.

In order to apply the matching termination to the received signal, the composite resistance value of the output resistance (hereafter represented as ZRDv) of the driver 51a and the termination resistor 7a (having a resistance value Rt) is made equal to the characteristic impedance R0 of the transmission line 4. If the characterist ic impedance R0 of the transmission line 4 is 50 ohms, it is necessary that Rt=100 ohms and ZRDv=100 ohms, for example. Furthermore, in order to make the input of the differential receiver 50a cancel the output signal, a divided voltage signal of the output of the reference driver 52a obtained from the bias circuit 54a is inputted to the input terminal 57a and a signal on the transmission line 4, which is a composite signal of the output of the driver 51a and the driver 51b, is inputted to the terminal 56a. By setting the potential of the input terminal 57a to an appropriate value according to the output of the reference driver 52, the input of the differential receiver 50a can cancel the output of the driver 51a and the output of the driver 51b can be received correctly.

To be concrete, when ZRDv=αR0, the voltage division ratio obtained by the reference driver 52a and the bias circuit 54a is set to the ratio of (2α−1) to 1. In the present embodiment, α=2, i.e., the output resistance value of the reference driver 52a is made equal to twice the characteristic impedance of the transmission line 4. Therefore, it is necessary to set the voltage division ratio obtained by the reference driver 52a and the bias circuit 54a to the ratio of 3 to 1. If at this time the resistance value Rt of the termination resistor 7a is represented as βR0, it follows that β=2, i.e., the resistance value of the termination resistor also becomes twice the characteristic impedance of the transmission line 4. In the present embodiment, the output resistance value of the reference driver 52a and the resistance value of the termination resistor 7a are thus set equal to twice the characteristic impedance of the transmission line 4. As a result, the average power consumed by the input/output circuit is reduced by approximately 40% as compared with the conventional technique. As a is increased, the average power typically decreases. On the other hand, increasing the a value decreases the amplitude of the signal on the transmission line and increases the susceptibility to the noise. Since there are such two mutually contradictory aspects, favorable results have been obtained in the present embodiment by letting α=β=2 and setting the voltage division ratio to the ratio of 3 to 1.

Figure 6:
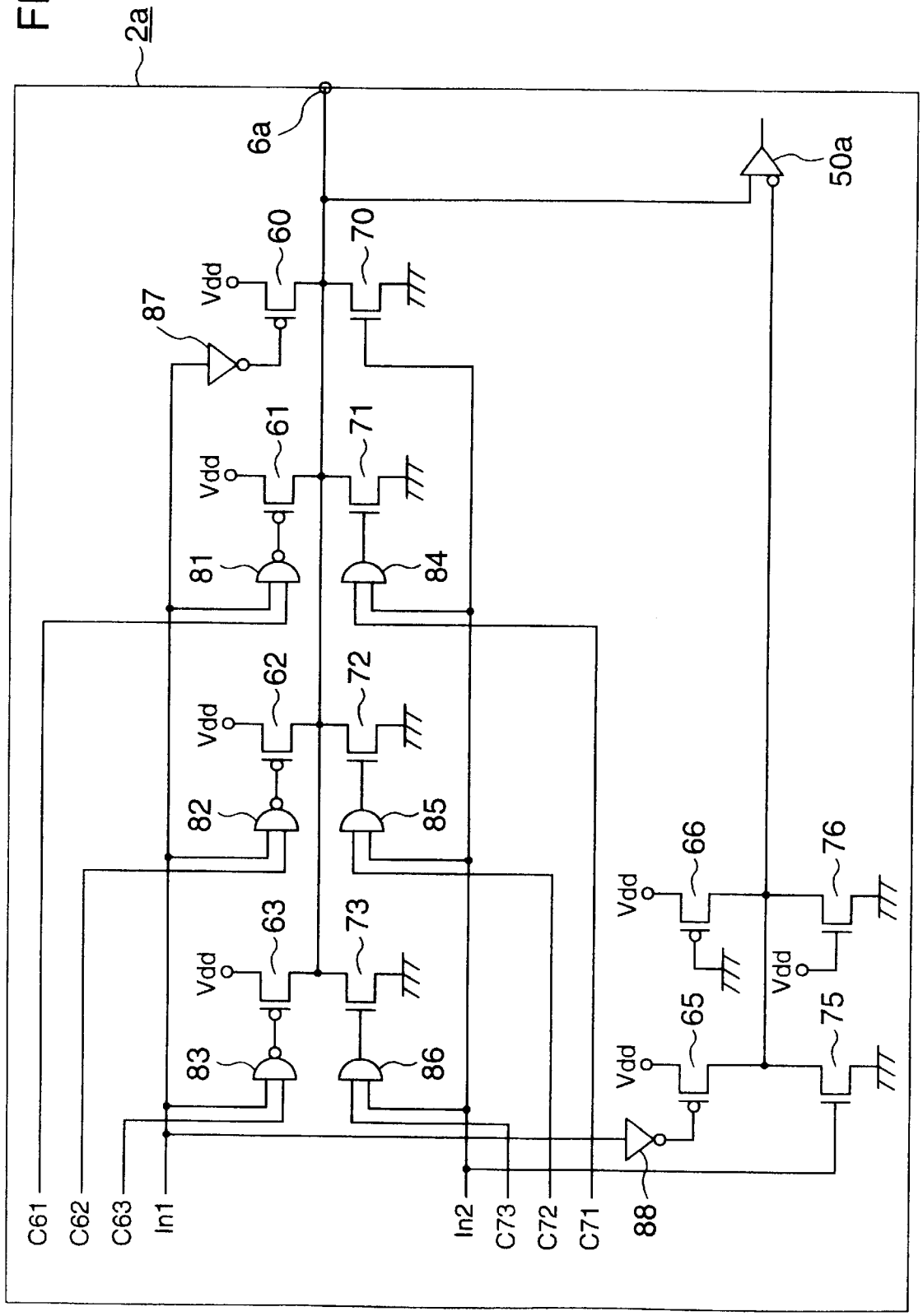
FIG. 6 is a circuit configuration diagram illustrating the configuration of an input/output circuit in the second embodiment.

More detailed description will be given by referring to FIG. 6. FIG. 6 is a diagram illustrating the configuration of the input/output circuit 2a shown in FIG. 5. In FIG. 6, numerals 60 through 63, 65 and 66 denote pMOS transistors and numerals 70 through 73, 75 and 76 denote nMOS transistors. The pMOS transistors 60 through 63 and the nMOS transistors 70 through 73 form the driver 51a. The pMOS transistor 65 and the nMOS transistor 75 form the reference driver 52a. The pMOS transistor 66 and the nMOS transistor 76 form the bias circuit 54a. In1 denotes an input signal to the pMOS transistors 60 through 63 and the pMOS transistor 65. In2 denotes an input signal to the nMOS transistors 70 through 73 and the nMOS transistor 75. The input signal In1 is opposite to the input signal In2. Characters C61 through C63 and C71 through C73 denote control signals for controlling on/off of the pMOS transistors 60 through 63 and the nMOS transistors 70 through 73. The control signals C61 through C63 and C71 through C73 correspond to the control signal Ca of FIG. 5. Numerals 81 through 83 denote NAND circuits. Numerals 84 through 86 denote AND circuits. Numerals 87 and 88 denote inverters.

In order to apply the matching termination to the received signal, potential values of the control signals C61 through C63 and C71 through C73 are set to appropriate values in the same way as the first embodiment. Furthermore, the composite resistance value of the equivalent resistance (hereafter represented as Rdv1) of the reference driver 52a and the termination resistor 7a is made equal to the characteristic impedance of the transmission line 4.

In order to make the input of the differential receiver 57a cancel the output signal, the ratio of the equivalent resistance of the pMOS transistor 65 and the nMOS transistor 75

(hereafter represented as R2) to the equivalent resistance of the pMOS transistor 66 and the nMOS transistor 76 (hereafter represented as R3) is set to the ratio 3 to 1 in the design. In the same way as RDv1, resistance values of R2 and R3 may also be controlled. Resistors built into the LSI may also be used. As for the power supply Vdd connected to source terminals of the pMOS transistors 60 through 63, 65 and 66, Vddq, which has a lower potential than Vdd, may also be used to reduce the power consumption in the same way as the first embodiment. The reference driver 52a has the same circuit configuration as the driver 51a in the same way as the first embodiment, and the transistor size and the load are selected properly.

Potential values at respective terminals of the circuit designed as heretofore described are shown in TABLE 2. It will be understood that each of the input/output circuits 2a and 2b can receive the signal outputted by the other party. In TABLE 2, Ina represents the input of the driver 51a and the reference driver 52a, Ina+ the input of the input terminal 56a of the differential receiver 50a, Ina− the input of the input terminal 57a of the differential receiver 50a, Outa the output of the output terminal 58a of the differential receiver 50a. In the same way, Inb represents the input of the driver 51b and the reference driver 52b, Inb+ the input of the input terminal 56b of the differential receiver 50b, Inb− the input of the input terminal 57b of the differential receiver 50b, Outb the output of the output terminal 58b of the differential receiver 50b. In the following description, these reference characters are used to represent the potentials of respective terminals in FIG. 5.

On the other hand, the Inb+ changes from Vdd/4 to Vdd/2 with a delay of Td after the Ina+ changed. Since the Inb− does not change, the potential difference (Inb+)−(Inb−) changes from −Vdd/8 to Vdd/8 and the Outb changes from 0 Vdd. Thus the input/output circuit 2b can receive the output signal of the input/output circuit 2a correctly.

If the Inb then changes from 0 Vdd, the Inb− changes from 3Vdd/8 to 5Vdd/8 and the Inb+ changes from Vdd/2 to 3Vdd/4. At this time, the potential difference (Inb+)−(Inb−) between the Inb+ and the Inb−remains to be Vdd/8, and the potential of the Outb does not change. On the other hand, the Ina+ changes from Vdd/2 to 3Vdd/4 with a delay of Td after the Inb+ changed. Since the Ina− does not change, the potential difference (Ina+)−(Ina−) changes from −Vdd/8 to Vdd/8 and the Outa changes from 0 Vdd. Thus the input/output circuit 2a can receive the output signal of the input/output circuit 2b correctly. Also in the case where the Ina or Inb changes from Vdd to 0, the output of the input/output circuit of the other party can be received correctly in the same way.

Figure 8:
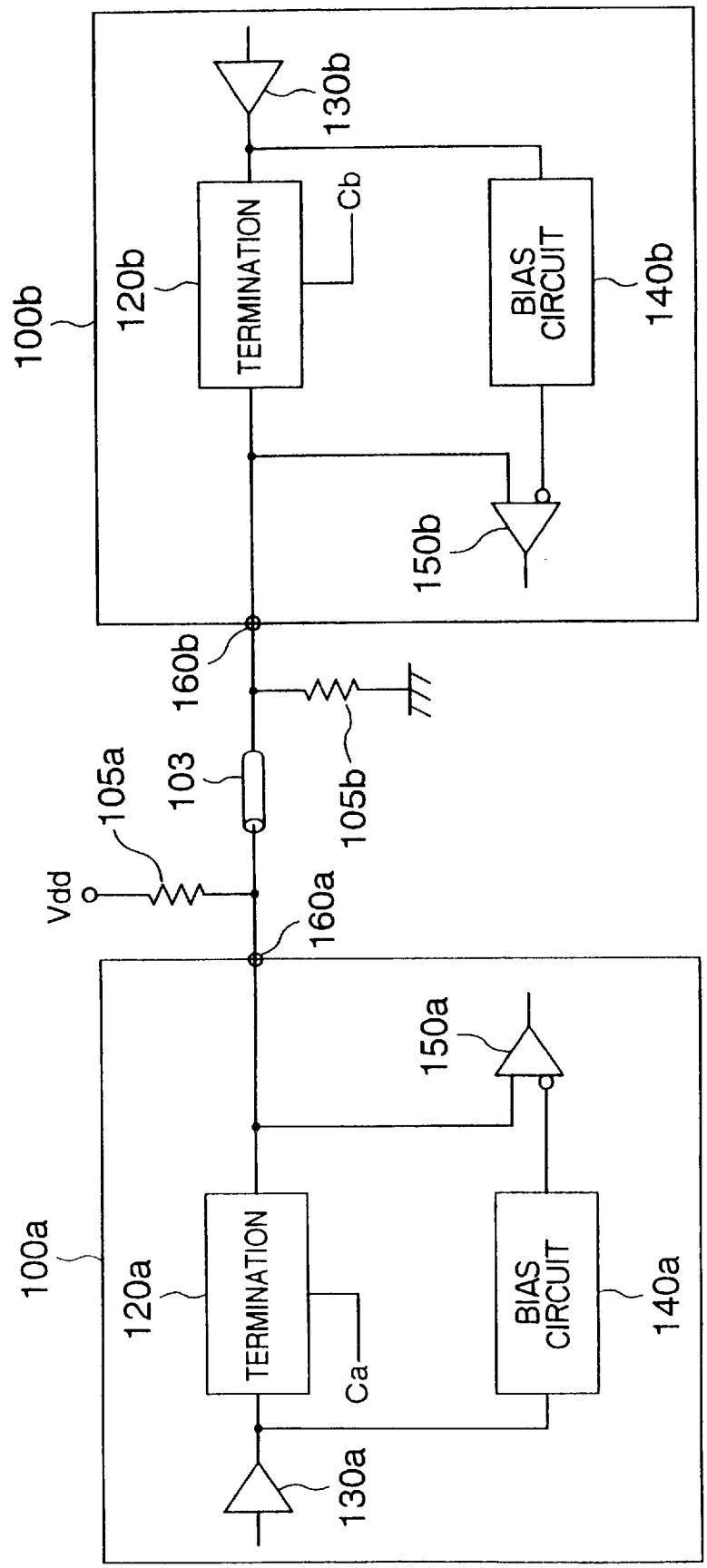
FIG. 8 is a block diagram of a third embodiment of a simultaneous bidirectional transmission circuit according to the present invention.

FIG. 8 is a block diagram showing a third embodiment of the simultaneous bidirectional transmission circuit according to the present invention.

In FIG. 8, 100a and 100b denote input/output circuits. Numeral 103 denotes a transmission line connecting the input/output circuits 100a and 100b. Characters 105a and 105b denote termination resistors. The input/output circuit 100a has a termination circuit 120a, a driver 130a, a bias circuit 140a, and a differential receiver 150a. The input/output circuit 100b has a termination circuit 120b, a driver

TABLE 2

| INPUT/OUTPUT CIRCUIT 1a | | | | | INPUT/OUTPUT CIRCUIT 1b | | | | |
|---|---|---|---|---|---|---|---|---|---|
| Ina | Ina+ | Ina− | (Ina+) − (ina−) | Outa | Inb | Inb+ | Inb− | (Inb+) − (Inb−) | Outb |
| 0 | Vdd/4 | 3Vdd/8 | −Vdd/8 | 0 | 0 | Vdd/4 | 3Vdd/8 | −Vdd/8 | 0 |
| 0 | Vdd/2 | 3Vdd/8 | Vdd/8 | Vdd | Vdd | Vdd/2 | 5Vdd/8 | −Vdd/8 | 0 |
| Vdd | Vdd/2 | 5Vdd/8 | −Vdd/8 | 0 | 0 | Vdd/2 | 3Vdd/8 | Vdd/8 | Vdd |
| Vdd | 3Vdd/4 | 5Vdd/8 | Vdd/8 | Vdd | Vdd | 3Vdd/4 | 5Vdd/8 | Vdd/8 | Vdd |

The input amplitude (Ina+)−(Ina−) of the differential receiver 50a is ±Vdd/8. In the case where Vdd=3.3 V, the input amplitude becomes ±412.5 mV. In the present embodiment as well, a sufficient amplitude can be obtained in the same way as the first embodiment.

Figure 7:
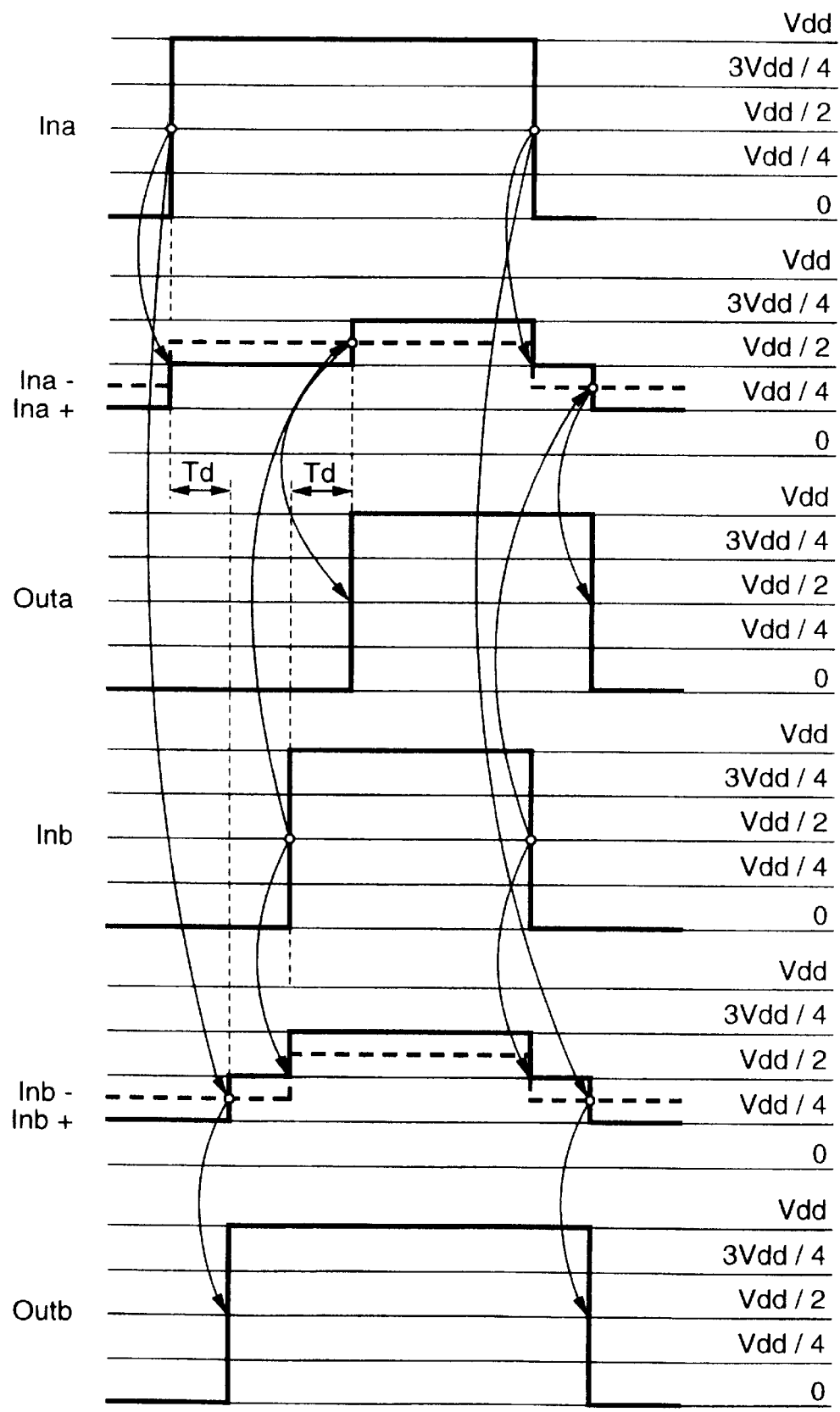
FIG. 7 is a time chart showing the operation of the input/output circuit illustrated in FIG. 5.

FIG. 7 is a time chart illustrating the operation of the circuit shown in FIG. 5. The signal propagation delay of the transmission line 4 is Td.

When the Ina changes from 0 Vdd, the Ina changes from 3Vdd/8 to 5Vdd/8 and the Ina+ changes from Vdd/4 to Vdd/2. At this time, the potential difference (Ina+)−(Ina−) remains to be −Vdd/8, and the Outa does not change. In the case where the Ina+ and the Ina− change simultaneously, the potential difference (Ina+)−(Ina−) between them is kept at −Vdd/8. In the case where the Ina+ changes faster than the Ina−, for example, however, the difference (Ina+)−(Ina−) temporarily becomes positive and the Outa rises, noise being caused. In order to avoid this noise, it is necessary to make the propagation delay of the route from the input terminal 55a to the input terminal 56a equal to some degree to the propagation delay of the route from the input terminal 55a to the input terminal 57a. Adjustment of the propagation delay is conducted by, for example, adding static capacitance having a small capacitance value between the output terminal 58a and the input terminal 57a of the driver 50a.

130b, a bias circuit 140b, and a differential receiver 150b. Character 160a denotes a connection point of the input/output circuit 100a with the transmission line 103. Character 160b denotes a connection point of the input/output circuit 100b with the transmission line 103. In FIG. 8, Ca and Cb denote control signals for controlling the impedance of the termination circuits 120a and 120b, respectively. In the present embodiment, the termination resistor 105a is connected between the connection point 160a of the input/output circuit 100a with the transmission line 103 and the power supply Vdd. Furthermore, the termination resistor 105b is connected between the connection point 160b of the input/output circuit 100b with the transmission line 103 and the ground. Hereafter, the configuration of mainly the input/output circuit 100a will be described in detail. The same holds true for the input/output circuit 100b as well.

As described above, the input/output circuit 100a has a termination circuit 120a, a driver 130a, a bias circuit 140a, and a differential receiver 150a. To the termination circuit 120a, one of terminals of the termination circuit 120a is connected. The other of terminals of the termination circuit 120a is connected to the transmission line 103 via the connection point 160a. Furthermore, the output of the output circuit 130a is connected to one terminal of the bias circuit 140a as well. To one of input terminals of the differential receiver 150a, a signal (Ina+) appearing on the connection point 160a is inputted. To the other of the input terminals of the differential receiver 150a, a signal (Ina−) obtained from the other terminal of the bias circuit 140a is inputted. To one input of the differential receiver 150a, therefore, a composite signal of the output signal of the driver 130a outputted via the termination circuit 120a and a received signal transmited from the input/output circuit 100b via the transmission line 103 is supplied. To the other input of the differential receiver 150a, the output signal fed from the driver 130a and subjected to voltage division in the bias circuit 140a is supplied.

In order to effect the impedance matching with respect to the transmission line 103, a composite resistance value of impedance $\alpha R$ ($\alpha>1$) of the termination circuit 120a and a resistance value $\beta R$ ($\beta>1$) of the termination resistor 105a is made equal to characteristic impedance R of the transmission line 103. In the present embodiment, the characteristic impedance R of the transmission line 103 is set to 50 ohms, and $\alpha=2$ and $\beta=2$. Therefore, the impedance of the termination circuit 120a is set to 100 ohms by adjusting the control signal Ca, and the impedance of the termination resistor 105a is provided with a value of 100 ohms. As for the driver impedance of the driver 130a, it is made sufficiently small to suppress the influence thereof. The voltage division ratio of the bias circuit 140a is set to the ratio of ($2\alpha-1$) to 1. Thereby, the divided voltage signal of the output of the bias circuit 140a becomes equal to the output signal supplied from the driver 103a onto the transmission line 103. As a result, the output signal component is canceled in the differential receiver 150a. As the output Outa of the differential receiver 150a, the received signal from the input/output circuit 100b can be taken out. Since $\alpha=2$ in the present embodiment as described above, the voltage division ratio in the bias circuit 140a becomes the ratio of 3 to 1.

Figure 9:
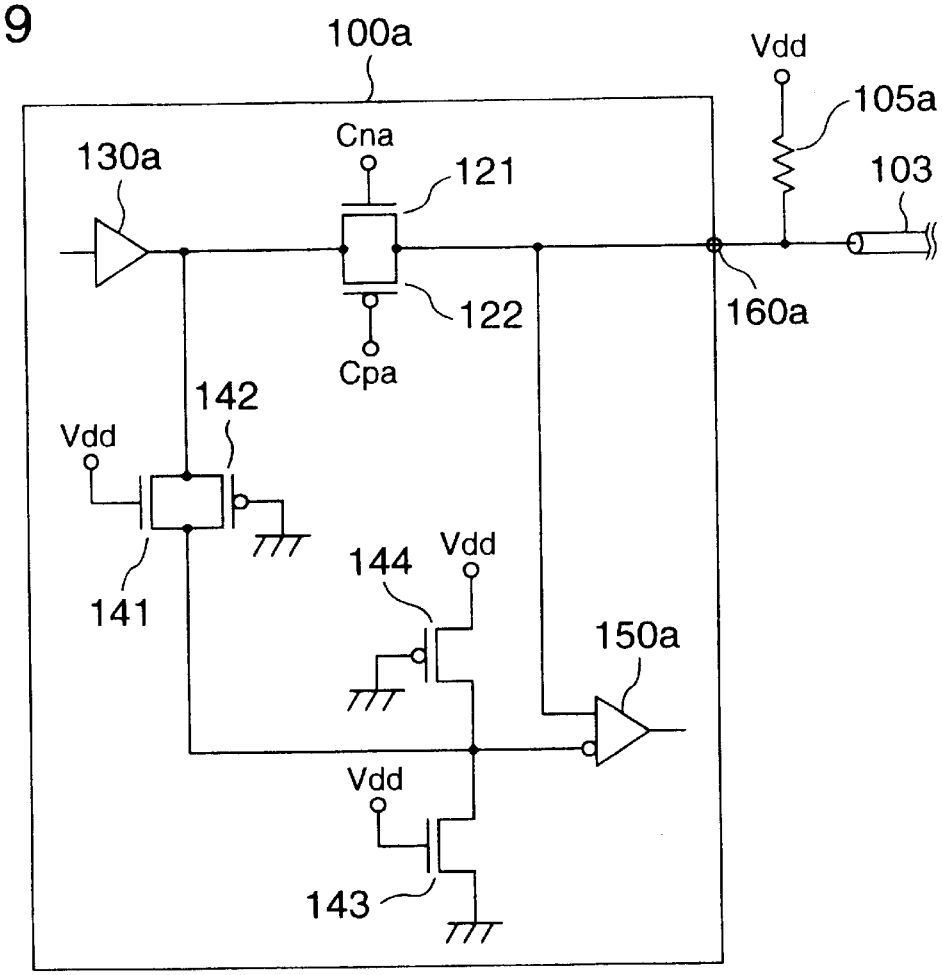
FIG. 9 is a circuit configuration diagram illustrating the configuration of an input/output circuit in the third embodiment.

FIG. 9 is a configuration diagram showing a configuration example of the input/output circuit in the case where the termination circuit 120a and the bias circuit 140a are formed by using MOS transistors.

In FIG. 9, numerals 121 and 122 denote an nMOS transistor and a pMOS transistor forming the termination circuit 120a, respectively. Source terminals of the transistors 121 and 122 are connected to the output terminal of the driver 130a. Drain terminals of the transistors 121 and 122 are connected to the connection point 160a. Characters Cna and Cpa denote control signals for controlling impedance values of the MOS transistors 121 and 122, respectively. The control signals Cna and Cpa correspond to the control signal Ca of FIG. 8. The control signals Cna and Cpa are supplied to gate terminals of the nMOS transistor 121 and the pMOS transistor 122, respectively. The impedance of the termination circuit 120a becomes the composite impedance of the MOS transistors 121 and 122. In the present embodiment, potential values of the control signals Cnp and Cpa are set so as to make this composite impedance equal to 100 ohms. Setting of the control signals Cna and Cpa can be conducted in the same way as the control signals of other embodiments heretofore described. In the case where the influence of the fabrication dispertion is not significant, the potential of the control signal Cna and the potential of the control signal Cpa can be fixed to the power supply voltage Vdd and the ground potential, respectively.

Numerals 141 and 143 denote nMOS transistors forming the bias circuit 140a. Numerals 142 and 144 denote pMOS transistors forming the bias circuit 140a. Source terminals of the nMOS transistor 141 and the pMOS transistor 142 are connected to the output terminal of the driver 130a. Drain terminals of the nMOS transistor 141 and the pMOS transistor 142 are connected to the input terminal of the differential receiver 150a. The gate terminal of the nMOS transistor 141 is connected to the Vdd. The gate terminal of the pMOS transistor is connected to the ground potential. Drain terminals of the nMOS transistor 143 and the pMOS transistor 144 are connected to the input terminal of the differential receiver 150a. The gate terminal of the nMOS transistor 143 and the source terminal of the pMOS transistor 144 are connected to the power supply Vdd. The source terminal of the nMOS transistor 143 and the gate terminal of the pMOS transistor 144 are connected to the ground potential. Furthermore, sizes of the nMOS transistor 143 and the pMOS transistor 144 are set so as to make impedance values of the nMOS transistor 143 and the pMOS transistor 144 nearly equal to each other. In order to make the voltage division ratio provided by the bias circuit 140a equal to a ratio of 3 to 1, the ratio of the composite impedance of the MOS transistors 141 and 142 to the composite impedance of the transistors 143 and 144 is set to the ratio of 3 to 1.

Denoting the input signal to the driver 130a by Ina, the signal supplied from the connection point 160a to one input terminal of the differential receiver 150a by Ina+, the signal supplied to the other input terminal of the differential receiver 150a via the bias circuit 140a by Ina−, and the output signal of the differential receiver 150a by Outa, potential values of various signals are represented in TABLE 2 in the same way as the second embodiment. Operation of the present embodiment can also be described in the same way as the second embodiment shown in FIG. 7.

The present embodiment has been described by referring to the case where the driver impedance of the driver 130a is sufficiently small as compared with the impedance of the termination circuit 120a. In the case where the driver impedance of the driver 130a is not negligible as compared with the impedance of the termiation circuit 120a, the sum of both impedance values is represented by $\alpha R$ in consideration. At this time, the ratio of the sum of the driver impedance of the driver 130a and the composite impedance of the MOS transistors 141 and 142 to the composite impedance of the MOS transistors 143 and 144 is set to the ratio of 3 to 1 ($2\alpha-1$ to 1).

Figure 10:
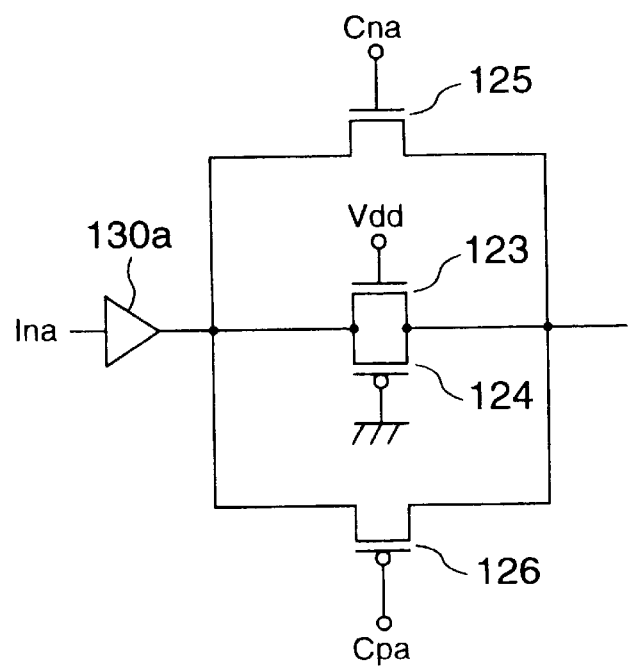
FIG. 10 is a partial circuit configuration diagram showing another configuration example of a termination circuit.

FIG. 10 is a partial circuit configuration diagram showing another configuration example of the termination circuit. In FIG. 10, numerals 123 and 125 denote nMOS transistors, numerals 124 and 126 denote pMOS transistors, and Cna and Cpa denote control signals for controlling whether the transistors 125 and 126 should be made conductive or nonconductive. The transistors 125 and 126 are connected in parallel with the transistors 123 and 124. Gate terminals of the transistors 123 and 124 are connected to the power supply terminal Vdd and the ground terminal, respectively. If the impedance values of the transistors 123 and 124 are larger than a desired value, then the control signals Cna and Cpa are respectively set to the Vdd and the ground potential to lower the impedance of the termination circuit. By thus increasing the number of transistors, the resistance value can be controlled more precisely.

Figure 11:
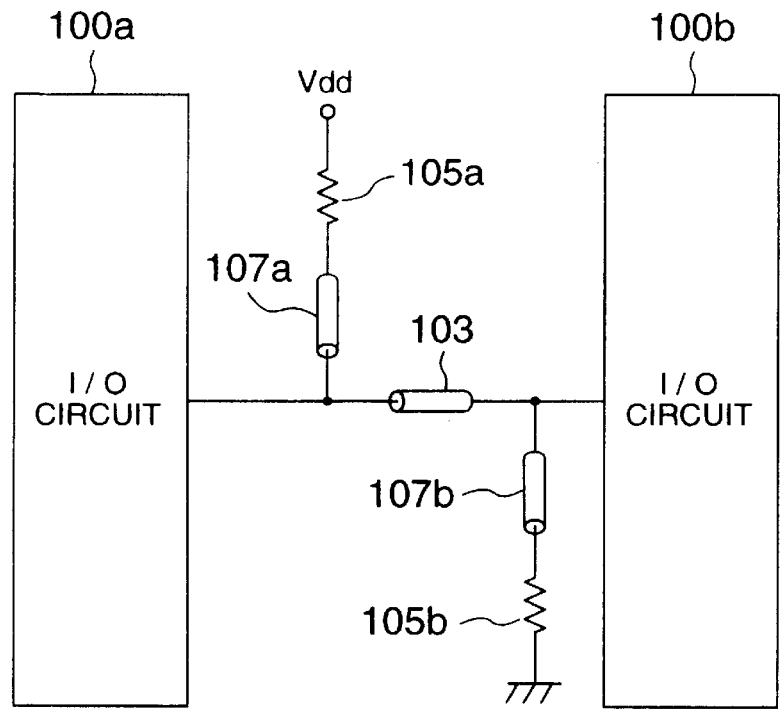
FIG. 11 is a block diagram showing another connection example of termination resistors.

FIG. 11 is a block diagram showing another connection example of termination resistors.

In FIG. 11, 107a and 107b denote transmission lines for connecting termination resistors 105a and 105b to the transmission line 103, respectively. When the termination resistors 105a and 105b are to be connected to the transmission line 103, wiring each having a length of several centimeters between them is needed in some cases. In this case, the termination resistors 105a and 105b are connected to the transmission line via the transmission lines 107a and 107b each having a required length. Characteristic impedance values of the transmission lines 107a and 107b are set equal to impedance values of the termination resistors 105a and 105b, respectively. Thus it is attempted to avoid the influence of insertion of the transmission lines.

Figure 12:
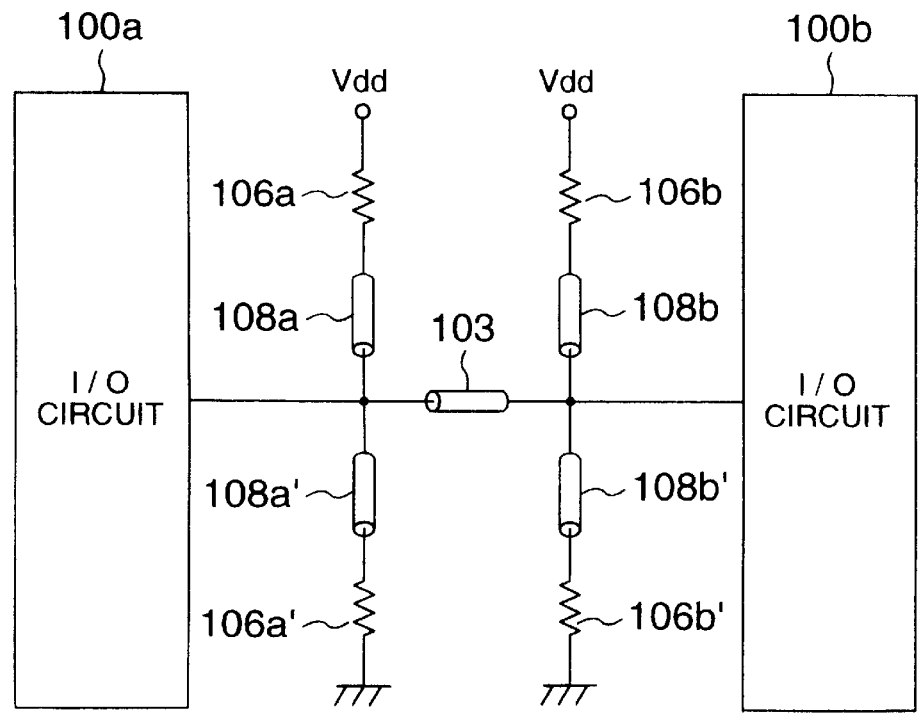
FIG. 12 is a block diagram showing another connection example of termination resistors.

FIG. 12 is a block diagram showing another connection example of termination resistors. In FIG. 12, two termination resistors are connected to each connection point of the transmission line with the input/output circuits. One of the two termination resistors is connected between the connection point and the power supply Vdd. The other of the two termination resistors is connected between the connection point and the ground potential.

In FIG. 12, 106a and 106a' denote termination resistors installed on the connection point of the transmission line 103 with the input/output circuit 100a, and 106b and 106b' denote termination resistors installed on the connection point of the transmission line 103 to the input/output circuit 100b. Furthermore, 108a, 108a', 108b and 108b' denote transmission lines for connecting respective termination resistors to the connection points, respectively. In the configuration shown in FIG. 12, the impedance of each termination resistor is set equal to twice (2βR) the impedance of the termination resistors in the circuits shown in FIGS. 8 and 9. The characteristic impedance of each of the transmission lines 108a, 108a', 108b and 108b' is set to 2βR in the same way. These termination resistors 106a, 106a', 106b and 106b' and transmission lines 108a, 108a', 108b and 108b' are installed outside the input/output circuits. By using such a termination method, the transmission line 103 is subjected to impedance matching and the signal level on the transmission line 103 does not change from that of the circuits shown in FIGS. 8 and 9. In the case where respective termination resistors can be disposed near the connection points, the above described transmission lines can be omitted.

Figure 13:
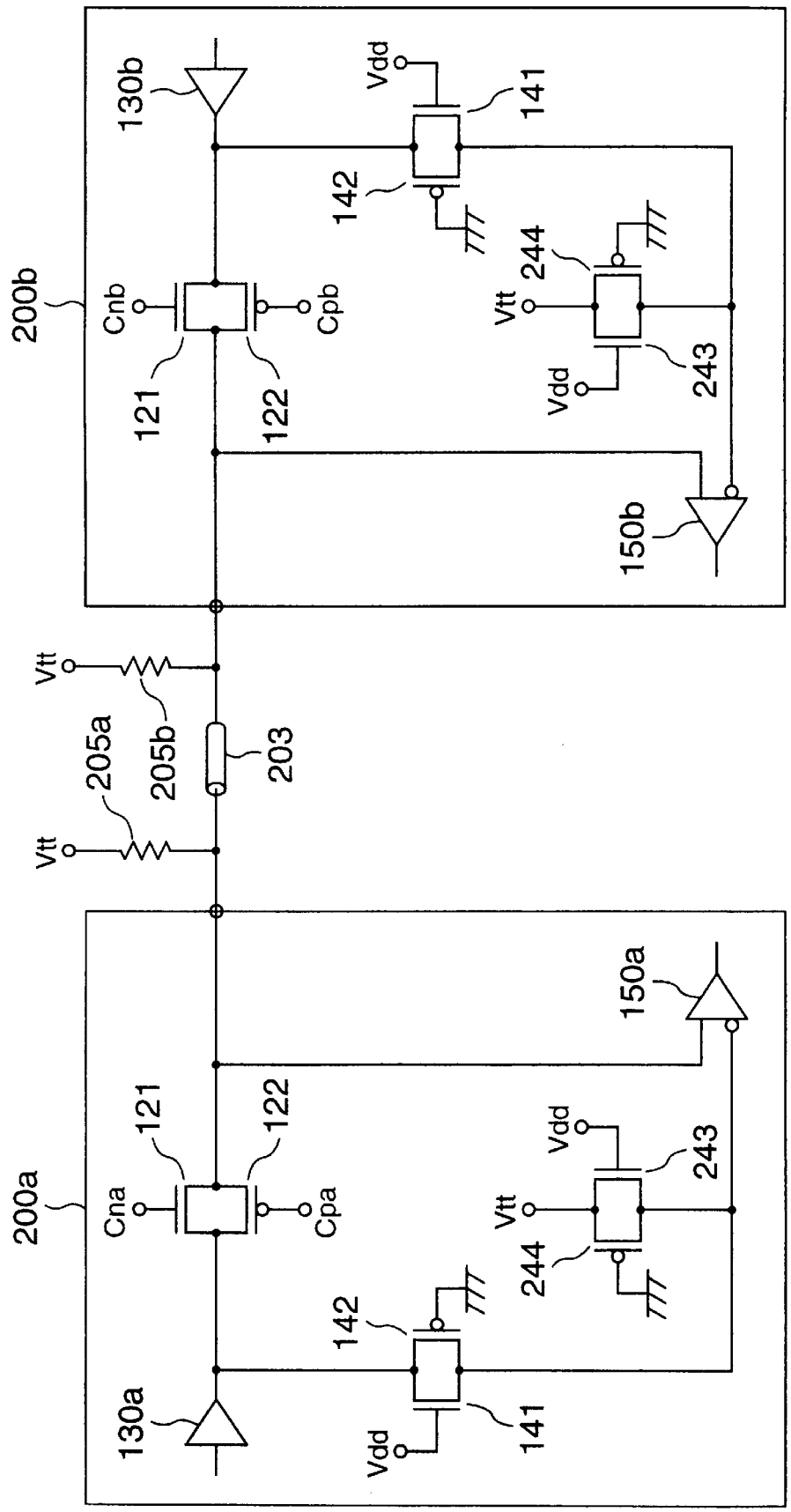
FIG. 13 is a block diagram of a fourth embodiment of a simultaneous bidirectional transmission circuit according to the present invention.

FIG. 13 is a block diagram showing a fourth embodiment of the simultaneous bidirectional transmission circuit according to the present invention. In FIG. 13, the circuit configuration of the input/output circuit 200b is not illustrated. In the same way as other embodiments, however, the input/output circuit 200b has the same configuration as the input/output circuit 200a has.

In the present embodiment, Vtt is added as a third power supply in addition to the power supply Vdd and the ground potential. On each of both the side of the input/output circuit 200a (termination resistor 205a) and the side of the input/output circuit 200b (termination resistor 205b), a termination resistor is connected between the connection point of the input/output circuit with the transmission line 203 and the power supply Vtt. In the same way as the third embodiment, the resistance value of each of the termination resistors 205a and 205b is βR, where β>1 and R is the characteristic impedance of the transmission line 203. Instead of the nMOS transistor 143 and the pMOS transistor 144 included in the MOS transistors forming the bias circuit, an nMOS transistor 243 and a pMOS transistor 244 each having a drain terminal connected to the power supply Vtt and a source terminal connected to one input of the differential receiver 150a are installed. The gate terminal of the nMOS transistor 243 is connected to the power supply Vdd, and the gate terminal of the pMOS transistor 244 is connected to the ground potential. Other portions of the input/output circuit is the same as those of the third embodiment. In FIG. 13 as well, the other portions are provided with the same reference numerals and reference characters as those of FIG. 9. The voltage value of the power supply Vtt is set equal to Vdd/2. In this case, the operation of the circuit and signal levels at various points of the circuit are the same as the third embodiment. In the same way as the foregoing description of the third embodiment, the termination resistors 205a and 205b may be connected to the connection points 160a and 160b via different transmission lines, respectively.

We claim:

1. A large-scale integration circuit (LSI), for conducting simultaneous bidirectional transmission of information with another large-scale integration circuit (another LSI) via a transmission line, comprising an input/output circuit connected to a transmission line, said input/output circuit comprising:

a driver for receiving, at an input thereof, a logical signal generated from within that LSI and sending out an output signal to said transmission line in accordance with said logical signal, wherein said driver includes a driver resistance connected to an output end of said input/output circuit which provides said output signal to said transmission line and means for controlling said driver resistance so as to be matched with a characteristic impedance of said transmission line;

a reference driver receiving said logical signal generated from within that LSI;

a bias circuit applying voltage division with a ratio of substantially 1 to 1 to said logical signal by using an internal resistance of said reference driver and of said bias circuit and thereby generating a divided voltage signal; and a differential receiver having inputted thereto said divided voltage signal and a signal on said transmission line and outputting therefrom a signal received from the other LSI;

wherein said bias circuit includes a composite impedance formed of an arrangement of MOS transistors, said MOS transistors having gate terminals supplied with a voltage level of one of first and second power supplies which forms an amplitude level of said logical signal.

2. A simultaneous bidirectional transmission circuit for simultaneously transmitting and receiving signals between a first large-scale integration circuit (first LSI) and a second large-scale integration circuit (second LSI) via a transmission line connecting said first and second LSIs, said simultaneous bidirectional transmission circuit comprising:

a first input/output circuit contained in said first LSI;

a second input/output circuit contained in said second LSI; and a transmission line connecting said first and second input/output circuits, wherein each of said first and second input/output circuits comprises:

a driver for receiving, at an input thereof, a logical signal generated from within that LSI and sending out an output signal to said transmission line in accordance with said logical signal, wherein said driver includes a driver resistance connected to an output end of said input/output circuit which provides said output signal to said transmission line and means for controlling said driver resistance so as to be matched with a characteristic impedance of said transmission line;

a reference driver receiving said logical signal generated from within that LSI;

a bias circuit applying voltage division with a ratio of substantially 1 to 1 to said logical signal by using an internal resistance of said reference driver and of said bias circuit and thereby generating a divided voltage signal; and a differential receiver having inputted thereto said divided voltage signal and a signal on said transmission line and outputting therefrom a signal received from the other of said first and second LSIs;

wherein said bias circuit includes a composite impedance formed of an arrangement of MOS transistors, said MOS transistors having gate terminals supplied with a voltage level of one of first and second power supplies which forms an amplitude level of said logical signal.

3. A simultaneous bidirectional transmission circuit according to claim 2, wherein each said differential receiver has a first input terminal supplied with a signal appearing on a connection point of one of said first and second input/output circuits corresponding thereto with said transmission line and a second input terminal supplied with said divided voltage signal of that input/output circuit, wherein said reference driver, which receives said logical signal, comprises a first nMOS transistor having a source terminal connected to the second input terminal of said differential receiver and a drain terminal connected to a third power supply and a second nMOS transistor having a source terminal connected to said second power supply and a drain terminal connected to the second input terminal of said differential receiver, and a high level and a low level of a signal supplied to gate terminals of said first and second nMOS transistors are a potential of said first power supply and a potential of said second power supply, respectively, wherein said bias circuit comprises a third nMOS transistor having a source terminal connected to the second input terminal of said differential receiver, a drain terminal connected to said third power supply, and a gate terminal connected to said first power supply, and a fourth nMOS transistor having a source terminal connected to said second power supply, a drain terminal connected to the second input terminal of said differential receiver, and a gate terminal connected to said first power supply, and wherein said divided voltage signal is generated by using a composite impedance formed by the first and second nMOS transistors and a composite impedance formed by the third and fourth MOS transistors.

4. A simultaneous bidirectional tranmission circuit according to claim 3, wherein said third power supply has potential lower than the potential of first power supply minus a threshold voltage of the nMOS transistors.

5. A simultaneous bidirectional transmission circuit for simultaneously transmitting and receiving signals between a first large-scale integration circuit (first LSI) and a second large-scale integration circuit (second LSI) via a transmission line connecting said first and second LSIs, said simultaneous bidirectional transmission circuit comprising:

a first input/output circuit contained in said first LSI;

a second input/output circuit contained in said second LSI;

a transmission line connecting said first and second input/output circuits, a first resistor connected between a connection point of said first input/output circuit with said transmission line (first connection point) and a first power supply, said first resistor being disposed outside said first LSI; and a second resistor connected between a connection point of said second input/output circuit with said transmission line second (second connection point) and a second power supply, said second resistor being disposed outside said second LSI;

each of said first and second input/output circuits comprising:

a driver for receiving, at an input thereof, a logical signal generated from within that LSI and sending out an output signal to the transmission line in accordance with said logical signal, wherein said driver includes a driver resistance connected to an output end thereof which provides said output signal to said transmission line and means for controlling said driver resistance so as to be matched with a characteristic impedance of said transmission line;

a reference driver receiving said logical signal generated from within that LSI;

a bias circuit applying voltage division with a ratio of substantially $(2\alpha-1)$ to 1 (where $\alpha>1$) to said logical signal by using an internal resistance of said reference driver and of said bias circuit and thereby generating a divided voltage signal; and a differential receiver having inputted thereto said divided voltage signal and a signal on said transmission line and outputting therefrom a signal received from the other of said first and second LSIs;

wherein said bias circuit includes a composite impedance formed of an arrangement of MOS transistors, said MOS transistors having gate terminals supplied with a voltage level of one of said first and second power supplies which forms an amplitude level of said logical signal.

6. A simultaneous bidirectional transmission circuit according to claim 5, wherein the ratio of said voltage division is substantially 3 to 1.

7. A simultaneous bidirectional transmission circuit according to claim 5, wherein each said differential receiver has a first input terminal supplied with a signal appearing on the connection point of one of said first and second input/output circuits corresponding thereto with said transmission line and a second input terminal supplied with said divided voltage signal of that input/output circuit, wherein said reference driver, which receives said logical signal, comprises a first pMOS transistor having a drain terminal connected to the second input terminal of said differential receiver and a source terminal connected to said first power supply and a first nMOS transistor having a source terminal connected to said second power supply and a drain terminal connected to the second input terminal of said differential receiver, and a high level and a low level of a signal supplied to gate terminals of said first pMOS transistor and said first nMOS transistor are a potential of said first power supply and a potential of said second power supply, respectively, wherein said bias circuit comprises a second pMOS transistor having a drain terminal connected to the second input terminal of said differential receiver, a source terminal connected to said first power supply, and a gate terminal connected to said second power supply, and a second nMOS transistor having a source terminal connected to said second power supply, a drain terminal connected to the second input terminal of said differential receiver, and a gate terminal connected to said first power supply, and wherein said divided voltage signal is generated by using a composite impedance formed by the first pMOS transistor and the first nMOS transistor and a composite impedance formed by the second pMOS transistor and the second nMOS transistor.

8. A simultaneous bidirectional transmission circuit for simultaneously transmitting and receiving signals between a first large-scale integration circuit (first LSI) and a second large-scale integration circuit (second LSI) via a transmission line connecting said first and second LSI, said simultaneous bidirectional transmission circuit comprising:

a first input/output circuit contained in said first LSI;

a second input/output circuit contained in said second LSI; and a transmission line connecting said first and second input/output circuits, a first resistor connected between a connection point of said first input/output circuit with said transmission line (first connection point) and a first power supply, said first resistor being disposed outside said first LSI; and a second resistor connected between a connection point of said second input/output circuit with transmission line (second connection point) and a second power supply, said second resistor being disposed outside said second LSI;

each of said first and second input/output circuits comprising:

a driver for receiving, at an input thereof, a logical signal generated from within that LSI and, in response thereto, sending out an output signal to said transmission line via a transfer gate;

a bias circuit applying voltage division with a ratio of substantially $(2\alpha-1)$ to 1 (where $\alpha>1$) to said logical signal and thereby generating a divided voltage signal; and a differential receiver having inputted thereto said divided voltage signal and a signal on said transmission line and outputting therefrom a signal received from the other of said first and second LSIs;

wherein said bias circuit includes a composite impedance formed of an arrangement of MOS transistors, said MOS transistors having gate terminals supplied with a voltage level of one of said first and second power supplies which forms an amplitude level of said logical signal.

9. A large-scale integration circuit (LSI), for conducting simultaneous bidirectional transmission of information with another large-scale integration circuit (another LSI) via a transmission line, comprising an input/output circuit connected to a transmission line, said input/output circuit comprising:

a driver for receiving, at an input thereof, a logical signal generated from within that LSI and sending out an output signal to said transmission line in accordance with said logical signal, wherein said driver includes a driver resistance connected to an output end of said input/output circuit which provides said output signal to said transmission line and is adapted to effect control of said driver resistance so as to be matched with a characteristic impedance of said transmission line;

a reference driver receiving said logical signal generated from within that LSI;

a bias circuit applying voltage division with a ratio of substantially 1 to 1 to said logical signal by using an internal resistance of said reference driver and of said bias circuit and thereby generating a divided voltage signal; and a differential receiver having inputted thereto said divided voltage signal and a signal on said transmission line and outputting therefrom a signal indicative of an incoming signal on said transmission line;

wherein said bias circuit includes a composite impedance formed of an arrangement of MOS transistors, said MOS transistors having gate terminals supplied with a voltage level of one of first and second power supplies which forms an amplitude level of said logical signal.

10. A simultaneous bidirectional transmission circuit for simultaneously transmitting and receiving signals between a first large-scale integration circuit (first LSI) and a second large-scale integration circuit (second LSI) via a transmission line connecting said first and second LSIs, said simultaneous bidirectional transmission circuit comprising:

a first input/output circuit contained in said first LSI;

a second input/output circuit contained in said second LSI; and a transmission line connecting said first and second input/output circuits, wherein each of said first and second input/output circuits comprises:

a driver for receiving, at an input thereof, a logical signal generated from within that LSI and sending out an output signal to said transmission line in accordance with said logical signal, wherein said driver includes a driver resistance connected to an output end of that input/output circuit which provides said output signal to said transmission line and is adapted to effect control of said driver resistance so as to be matched with a characteristic impedance of said transmission line;

a reference driver receiving said logical signal generated from within that LSI;

a bias circuit applying voltage division with a ratio of substantially 1 to 1 to said logical signal by using an internal resistance of said reference driver and of said bias circuit and thereby generating a divided voltage signal; and a differential receiver having inputted thereto said divided voltage signal and a signal on said transmission line and outputting therefrom a signal indicative of an incoming signal on said transmission line;

wherein said bias circuit includes a composite impedance formed of an arrangement of MOS transistors, said MOS transistors having gate terminals supplied with a voltage level of one of first and second power supplies which forms an amplitude level of said logical signal.

11. A simultaneous bidirectional transmission circuit according to claim 10, wherein each said differential receiver has a first input terminal supplied with a signal appearing on a connection point of one of said first and second input/output circuits corresponding thereto with said transmission line and a second input terminal supplied with said divided voltage signal of that input/output circuit, wherein said reference driver, which receives said logical signal, comprises a first nMOS transistor having a source terminal connected to the second input terminal of said differential receiver and a drain terminal connected to a third power supply and a second nMOS transistor having a source terminal connected to said second power supply and a drain terminal connected to the second input terminal of said differential receiver, and a high level and a low level of a signal supplied to gate terminals of said first and second nMOS transistors are a potential of said first power supply and a potential of said second power supply, respectively, wherein said bias circuit comprises a third nMOS transistor having a source terminal connected to the second input terminal of said differential receiver, a drain terminal connected to said third power supply, and a gate terminal connected to said first power supply, and a fourth nMOS transistor having a source terminal connected to said second power supply, a drain terminal connected to the second input terminal of said differential receiver, and a gate terminal connected to said first power supply, and wherein said divided voltage signal is generated by using a composite impedance formed by the first and second nMOS transistors and a composite impedance formed by the third and fourth nMOS transistors.

12. A simultaneous directional transmission circuit according to claim 11, wherein said third power supply has potential lower than the potential of said first power supply minus a threshold voltage of the nMOS transistors.

13. A simultaneous bidirectional transmission circuit for simultaneously transmitting and receiving signals between a first large-scale integration circuit (first LSI) and a second large-scale integration circuit (second LSI) via a transmission line connecting said first and second LSIs, said simultaneous bidirectional transmission circuit comprising:

a first input/output circuit contained in said first LSI;

a second input/output circuit contained in said second LSI;

a transmission line connecting said first and second input/output circuits, a first resistor connected between a connection point of said first input/output circuit with said transmission line (first connection point) and a first power supply, said first resistor being disposed outside said first LSI; and a second resistor connected between a connection point of said second input/output circuit with said transmission line (second connection point) and a second power supply, said second resistor being disposed outside said second LSI;

each of said first and second input/output circuits comprising:

a driver for receiving, at an input thereof, a logical signal generated from within that LSI and sending out an output signal to the transmission line in accordance with said logical signal, wherein said driver includes a driver resistance connected to an output end thereof which provides said output signal to said transmission line and is adapted to effect control of said driver resistance so as to be matched with a characteristic impedance of said transmission line;

a reference driver receiving said logical signal generated from within that LSI;

a bias circuit applying voltage division with a ratio of substantially $(2\alpha-1)$ to 1 (where $\alpha>1$) to said logical signal by using an internal resistance of said reference driver and of said bias circuit and thereby generating a divided voltage signal; and a differential receiver having inputted thereto said divided voltage signal and a signal on said transmission line and outputting therefrom a signal received, via said transmission line, from the other of said first and second LSIs;

wherein said bias circuit includes a composite impedance formed of an arrangement of MOS transistors, said MOS transistors having gate terminals supplied with a voltage level of one of first and second power supplies which forms an amplitude level of said logical signal.

14. A simultaneous bidirectional transmission circuit according to claim 13, wherein the ratio of said voltage division is substantially 3 to 1.

15. A simultaneous bidirectional transmission circuit according to claim 13, wherein each said differential receiver has a first input terminal supplied with a signal appearing on the connection point of one of said first and second input/output circuits corresponding thereto with said transmission line and a second input terminal supplied with said divided voltage signal of that input/output circuit, wherein said reference driver, which receives said logical signal, comprises a first pMOS transistor having a drain terminal connected to the second input terminal of said differential receiver and a source terminal connected to said first power supply and a first nMOS transistor having a source terminal connected to said second power supply and a drain terminal connected to the second input terminal of said differential receiver, and a high level and a low level of a signal supplied to gate terminals of said first pMOS transistor and said first nMOS transistor are a potential of said first power supply and a potential of said second power supply, respectively, wherein said bias circuit comprises a second pMOS transistor having a drain terminal connected to the second input terminal of said differential receiver, a source terminal connected to said first power supply, and a gate terminal connected to said second power supply, and a second nMOS transistor having a source terminal connected to said second power supply, a drain terminal connected to the second input terminal of said differential receiver, and a gate terminal connected to said first power supply, and wherein said divided voltage signal is generated by using a composite impedance formed by the first pMOS transistor and the first nMOS transistor and a composite impedance formed by the second pMOS transistor and the second nMOS transistor.

16. A simultaneous bidirectional transmission circuit for simultaneously transmitting and receiving signals between a first large-scale integration circuit (first LSI) and a second large-scale integration circuit (second LSI) via a transmission line connecting said first and second LSIs, said simultaneous bidirectional transmission circuit comprising:

a first input/output circuit contained in said first LSI;

a second input/output circuit contained in said second LSI; and a transmission line connecting said first and second input/output circuits, a first resistor connected between a connection point of said first input/output circuit with the transmission line (first connection point) and a first power supply, said first resistor being disposed outside said first LSI; and a second resistor connected between a connection point of said second input/output circuit with the transmission line (second connection point) and a second power supply, said second resistor being disposed outside said second LSI;

each of said first and second input/output circuits comprising:
- a driver for receiving, at an input thereof, a logical signal generated from within that LSI and, in response thereto, sending out an output signal to said transmission line via a transfer gate;
- a bias circuit applying voltage division with a ratio of substantially $(2\alpha-1)$ to 1 (where $\alpha>1$) to said logical signal and thereby generating a divided voltage signal;
- a differential receiver having a first input applied with said divided voltage signal and a second input applied with a mixed incoming/outgoing signal on said transmission line and outputting therefrom a signal indicative of an incoming signal on said transmission line;

wherein said bias circuit includes a composite impedance formed of an arrangement of MOS transistors, said MOS transistors having gate terminals supplied with a voltage level of one of said first and second power supplies which forms an amplitude level of said logical signal.

* * * * *